(12) United States Patent
Inoue

(10) Patent No.: US 7,897,067 B2
(45) Date of Patent: Mar. 1, 2011

(54) AMORPHOUS TRANSPARENT CONDUCTIVE FILM, SPUTTERING TARGET AS ITS RAW MATERIAL, AMORPHOUS TRANSPARENT ELECTRODE SUBSTRATE, PROCESS FOR PRODUCING THE SAME AND COLOR FILTER FOR LIQUID CRYSTAL DISPLAY

(75) Inventor: Kazuyoshi Inoue, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 1478 days.

(21) Appl. No.: 10/557,194

(22) PCT Filed: Apr. 19, 2004

(86) PCT No.: PCT/JP2004/005545

§ 371 (c)(1),
(2), (4) Date: Nov. 17, 2005

(87) PCT Pub. No.: WO2004/105054

PCT Pub. Date: Dec. 2, 2004

(65) Prior Publication Data

US 2007/0117237 A1 May 24, 2007

(30) Foreign Application Priority Data

May 20, 2003 (JP) .............................. 2003-141429
Oct. 30, 2003 (JP) .............................. 2003-370357

(51) Int. Cl.
*H01B 1/08* (2006.01)
*H01B 13/00* (2006.01)
*H01B 5/14* (2006.01)
*C23C 14/08* (2006.01)
*C23C 14/34* (2006.01)

(52) U.S. Cl. .............................. 252/519.51; 252/520.1; 204/192.15

(58) Field of Classification Search ............ 252/519.51, 252/520.1; 204/192.15; 428/432
See application file for complete search history.

(56) References Cited

U.S. PATENT DOCUMENTS

| 6,534,183 | B1 * | 3/2003 | Inoue | 428/432 |
| 6,689,477 | B2 * | 2/2004 | Inoue | 428/432 |
| 6,998,070 | B2 * | 2/2006 | Inoue et al. | 252/519.51 |
| 2001/0008710 | A1 * | 7/2001 | Takatsuji et al. | 428/689 |

FOREIGN PATENT DOCUMENTS

| EP | 1 233 082 | 8/2002 |
| EP | 1 408 137 | 4/2004 |

(Continued)

*Primary Examiner*—Mark Kopec
(74) *Attorney, Agent, or Firm*—Oblon, Spivak, McClelland, Maier & Neustadt, L.L.P.

(57) ABSTRACT

A transparent conductive film of low resistivity excelling in transparency and etching properties; a sputtering target as its raw material; an amorphous transparent electrode substrate having the transparent conductive film superimposed on a substrate; and a process for producing the same. In particular, an amorphous transparent conductive film comprising at least indium oxide and zinc oxide, which contains at least one third metal selected from among Re, Nb, W, Mo and Zr and satisfies the formulae: $0.75 \leq [In]/([In]+[Zn]) \leq 0.95$ (1) $1.0 \times 10^{-4} \leq [M]/([In]+[Zn]+[M]) \leq 1.0 \times 10^{-2}$ (2) wherein [In][Zn] and [M] represent the atomicity of In, atomicity of Zn and atomicity of third metal, respectively. This amorphous transparent conductive film exhibits amorphism ensuring excellent etching processability and exhibits low specific resistance and high mobility.

13 Claims, 3 Drawing Sheets

FOREIGN PATENT DOCUMENTS

| | | |
|---|---|---|
| JP | 5-242745 | 9/1993 |
| JP | 06088973 | 3/1994 |
| JP | 6-243740 | 9/1994 |
| JP | 6-247765 | 9/1994 |
| JP | 07-235219 | 9/1995 |
| JP | 8-218465 | 8/1996 |
| JP | 09-286070 | 11/1997 |
| JP | 2000-9923 | 1/2000 |
| JP | 2000-72189 | 3/2000 |
| JP | 2000-72526 | 3/2000 |
| JP | 2000-207935 | 7/2000 |
| JP | 2001-323370 | 11/2001 |
| JP | 2002-110365 | 4/2002 |
| WO | 03/008661 | 1/2003 |

* cited by examiner

TYPE2A

TYPE2B

AMORPHOUS TRANSPARENT CONDUCTIVE FILM, SPUTTERING TARGET AS ITS RAW MATERIAL, AMORPHOUS TRANSPARENT ELECTRODE SUBSTRATE, PROCESS FOR PRODUCING THE SAME AND COLOR FILTER FOR LIQUID CRYSTAL DISPLAY

CROSS-REFERENCE TO RELATED APPLICATIONS

This application is a 371 of PCT/JP04/05545 filed Apr. 19, 2004 and claims the benefit of JP 2003141429 filed May 20, 2003 and JP 2003-370357 filed Oct. 30, 2003.

TECHNICAL FIELD

The present invention relates to an amorphous transparent electroconductive film, and a sputtering target used in a production process thereof; and an amorphous transparent electrode substrate using the amorphous transparent electroconductive film, and a production process thereof. The invention relates in particular to an amorphous transparent electroconductive film used for a thin film transistor-liquid crystal display (TFT-LCD), a super twisted nematic-liquid crystal display (STN-LCD), a twisted nematic-liquid crystal display (TN-LCD), an organic electroluminescence (EL) and so on, and a sputtering target used in a production process thereof; and an amorphous transparent electrode substrate using this amorphous transparent electroconductive film, and a production process thereof.

The present invention relates to a color filter for display. The invention relates in particular to a color filter for display characterized by the material of its electrode, and a display device using this filter.

The display is typically a liquid crystal display, and may be any display using a color filter. For example, the color filter of the invention may be used to make an organic EL display or the like.

BACKGROUND ART

Background Art No. 1 (Amorphous Transparent Electroconductive Film, Sputtering Target of Starting Material Thereof, and Amorphous Transparent Electrode Substrate)

A TFT-LCD, an STN-LCD, and a TN-LCD are used in a scope from relatively small-sized display sections of a cellular phone, a personal digital assistant (PDA), a notebook-sized personal computer and so on to large-sized display devices such as a monitor of a computer and a television screen.

In recent years, materials for electrodes of TFT-LCDs are shifting from amorphous silicon (referred to as amorphous Si hereinafter) type materials to polysilicon (referred to as "poly Si" hereinafter) type materials. The aim of this shift is to apply the LCDs to display sections for cellular phones coping with moving images or television screens by making the switching speed thereof large.

In the case of conventional amorphous Si type materials, the mobility thereof is about 1 $cm^2/V \cdot sec$.; therefore, an improvement in the switching speed is restricted. Thus, an attempt is made wherein amorphous Si is crystallized by a given method to prepare poly Si and the mobility thereof is improved to make the switching speed high. It is known that the mobility of this polycrystal Si (poly Si) type electrode material is improved up to about 200 $cm^2/V \cdot sec$.

It is reported that: in continuous grain boundary poly Si, crystal grains thereof are large and boundary lines between the crystals are continuous; accordingly, the mobility thereof is 400 $cm^2/V \cdot sec$. or more. In this way, about continuous grain boundary poly Si, researches for using the Si in pseudo monocrystal silicon TFT technique are widely made (see, for example, Non-patent Document 1, which will be listed up later).

Meanwhile, as electrodes of liquid crystal display devices using a liquid crystal, such as TFT-LCDs, there are used transparent electrodes which are transparent and have electroconductivity for transmitting electric signals to the liquid crystal.

As one of the transparent electrodes, indium thin oxide (ITO), which is made of indium oxide-tin oxide having transparency and a small resistivity, is known and is widely used. This ITO is a material having a small resistivity (resistivity: 200 $\mu\Omega \cdot cm$, carrier density: $1.0 \times 10^{21}/cm^3$, and mobility: 40 $cm^2/V \cdot sec$.), but has drawbacks such that a strong acid should be used when the ITO is etched. It is also known that if the carrier concentration in ITO is increased, the mobility thereof generally falls by ion scattering.

In order to solve such problems, Patent Documents 1 and 2, which will be listed up later, disclose a material comprising indium oxide-zinc oxide and further comprising Sn, Ga or Ge. It is known that a weak acid can be used to etch this material and the material is excellent in workability. However, the resistivity of the material disclosed in Patent Documents 1 and 2 is not very low. The mobility of the material is about 20 $cm^2/V \cdot sec$., which is a lower value than that of poly Si.

Patent Document 3, which will be listed up later, discloses a technique of making a material made of indium oxide-zinc oxide into a film by a low-voltage sputtering method in order to make the resistivity of this material low. However, in order to sputter the material at a low voltage, it is unavoidable to make the magnetic field of the sputtering device strong and overlap AC plasma with DC plasma. Thus, there arise problems that the device is expensive and further operations or steps therefor are complicated.

Patent Document 4, which will be listed up later, discloses a transparent electroconductive laminate wherein a transparent electroconductive film made mainly of indium, tin, zinc and oxygen atoms is formed on a polymer substrate and the composition at% satisfies the following: Zn/(In+Zn)=0.01 to 0.1 at %, Sn/(In+Sn)=0.01 to 0.1 at % and further Zn/(Zn+Sn)=0.55 to 1 at %. However, the resistivity of such a laminate is 250 $\mu\Omega \cdot cm$ or more. It cannot be said that this resistivity is far lower than conventional resistivities. When the transparent electroconductive laminate having the above-mentioned composition is heated, the laminate is crystallized. Thus, residues may be generated when the heated laminate is etched.

Meanwhile, Patent Documents 5 and 6, which will be listed up later, disclose sputtering targets obtained by adding, to indium oxide-zinc oxide, tin oxide in an amount of 20 to 2000 ppm. The main aim of the Patent Documents 5 and 6 is to control the crystal structure of the sputtering target and improve the mechanical strength thereof. Thus, no heed is given to the matter that the sputtering target is used to produce a film having a relatively low resistivity. Therefore, it appears that a low resistivity cannot be realized.

Patent Document 7, which will be listed up later, discloses a production of a material which is made of indium oxide-zinc oxide and is low in resistivity by controlling the crystal structure of a sputtering target used for producing this material.

Patent Document 8, which will be listed up later, discloses a process of producing a transparent electroconductive film low in resistivity by adding Re, Os, Mo or W to indium oxide or ITO and then controlling the orientation of the crystal thereof.

Patent Document 9, which will be listed up later, discloses a sintered, electroconductive metal oxide which is low in resistivity and is produced by adding, to indium oxide, Nb or Hf in an amount of 1 to 20% by weight thereof. Patent Documents 10 to 13, which will be listed up later, disclose transparent electrodes wherein Zr is added to indium oxide. However, all methods described in Patent Documents 7 to 13 have a problem that the resultant transparent electrodes have crystallinity and thus residues are generated by etching or nodules are generated at the time of sputtering.

Non-patent Document 1: "Electronic Material", Kogyo Chosakai Publishing Inc., December, 2002, p.26

Patent Document 1: Japanese Patent Application Laid-Open (JP-A) No. 6-234565

Patent Document 2: JP-A No. 7-235129
Patent Document 3: JP-A No. 9-71860
Patent Document 4: JP-A No. 2001-126538
Patent Document 5: JP-A No. 2001-131736
Patent Document 6: JP-A No. 11-128122
Patent Document 7: Japanese Patent Application National Publication No. 2001-539936
Patent Document 8: JP-A No. 7-278791
Patent Document 9: JP-A No. 3-15107
Patent Document 10: JP-A No. 6-160876
Patent Document 11: JP-A No. 7-218924
Patent Document 12: JP-A No. 2002-226966
Patent Document 13: JP-A No. 2002-373527

Background Art No. 2 (Color Filter for Liquid Crystal Display)

In color liquid crystal displays, color display is attained by use of optical property of liquid crystal, optical members, an external light source or the like. One of the optical members for attaining color display is a color filter. This color filter 100 for liquid crystal display generally has:

(1) an electrically insulating transparent substrate 10 which is also used as a substrate for forming a liquid crystal panel, (2) plural colored layers 12 arranged on this electrically insulating transparent substrate 10 so as to have a given pattern, and (3) a transparent electrode 14, for driving liquid crystal, which is formed on these colored layers 12. This situation is shown in FIG. 2A. In the present patent, this is called type 2A. The colored layers 12 are composed of a red colored layer 12R, a green colored layer 12G, and a blue colored layer 12B. FIG. 3 is a schematic structural view illustrating only the basic structure of the color filter 100 for liquid crystal display. Actually, a protective layer is formed between the colored layers 12 and the transparent electrode 14 in many cases. As will be detailed later, light-shielding layers are formed between the respective colored layers 12R, 12G and 12B in many cases. In FIGS. 2A and 2B, these light-shielding layers and soon are omitted not to be illustrated.

The position of the colored layers 12 and that of the transparent electrode 14 maybe reverse. In this case, the color filter 100 for liquid crystal display has, as its basic structure, the following:

(4) an electrically insulating transparent substrate 10 which is also used as a substrate for forming a liquid crystal panel, (5) a transparent electrode 14, for driving liquid crystal, which is formed on this electrically insulating substrate 10, and (6) plural colored layers 12 arranged on this transparent electrode so as to have a given pattern. This situation is shown in FIG. 2B. In the present patent, this is called type 2B.

The colored layers 12 are each a layer which selectively transmits a ray having a specific wavelength out of rays emitted from a light source, and are plural colored layers 12 having different spectral transmittance characteristics in accordance with whether multicolor display is performed or full color display is performed. For example, when full color display is performed by additive color mixture, layers of the following three kinds are used: a red colored layer 12R having a high spectral transmittance in a red wavelength range; a green colored layer 12G having a high spectral transmittance in a green wavelength range; and a blue colored layer 12B having a high spectral transmittance in a blue wavelength range.

As the arrangement pattern of these kinds of colored layers 12, a stripe type, a mosaic type, a triangle type, a 4-pixel arranged type, and so on have been hitherto known. Appropriate one out of these patterns is used in accordance with the operation mode of the color liquid crystal display or the performance thereof.

In many cases, a light-shielding layer is formed between a colored layer and another colored layer, or on a transparent protective layer which will be detailed later. This is for preventing a fall in the contrast or color purity based on leak light. The light-shielding layer in this case is made of metal chromium, a colored photoresist or the like. This light-shielding layer is arranged so as to be positioned between pixels when the front plane of a color liquid crystal display equipped with the color filter is viewed. The form of the whole thereof is generally a matrix form or stripe form in many cases.

As described above, the transparent electrode 14 for driving liquid crystal may be arranged between the electrically insulating substrate 10 and the above-mentioned colored layers 12 (type 2B). In many cases, however, the electrode would be arranged, directly or indirectly across a transparent protective layer, over the colored layers 12 in order to prevent an increase in the threshold voltage of the liquid crystal display element or a decline in the sharpness of the rise thereof.

The shape of this transparent electrode 14 for driving liquid crystal is varied in accordance with the operation mode or the performance of the color liquid crystal display, or other factors. The electrode 14 is formed into plural stripes or a single film. In FIGS. 2A and 2B, a situation that the whole of a screen is formed into a film, or into the so-called "solid" form is illustrated. In the case of an active matrix type TFT liquid crystal display device, this transparent electrode in the "single film" form has been hitherto arranged on the side of its color filter in many cases.

The transparent protective layer is formed in order to improve the flatness or the smoothness of the transparent electrode and protect the colored layers. As this liquid-crystal-driving transparent electrode, an indium thin oxide (ITO) film has been hitherto used in many cases. This is because the ITO film is good in transparency and electroconductivity and can be sufficiently etched with a strong acid.

Incidentally, the following lists up documents about the prior art related to the invention of the present patent application.

Patent Document 14: JP-A No. 11-352483
Patent Document 15: JP-A No. 2002-202511
Patent Document 16: JP-A No. 2003-143525
Patent Document 17: JP-A No. 07-120612
Patent Document 18: JP-A No. 09-101408
Patent Document 19: JP-A No. 09-005514

DISCLOSURE OF THE INVENTION

First Object (in Connection with Background Art No. 1)

The present invention has been made in light of the problems of the above-mentioned background art No. 1, and an object thereof is to provide a transparent electroconductive film having excellent transparency and etchable property, and a low resistance, a sputtering target of the starting material thereof, and an amorphous transparent electrode substrate wherein this transparent electroconductive film is formed on a substrate and a production process thereof.

Second Object (in Connection with Background Art No. 2)

The above-mentioned ITO film is relatively low in thermal stability and moisture and heat resistance. For this reason, a color filter for liquid crystal display of a type that the ITO film is formed as a liquid-crystal-driving transparent electrode on a colored layer has drawbacks that the liquid-crystal-driving transparent electrode is easily cracked or peeled in the production process thereof and the liquid-crystal-driving transparent electrode is easily cracked or peeled with the passage of time after the production.

As the performance of liquid crystal display devices becomes higher, new various driving manners are suggested for driving liquid crystal. For example, the Patent Document 14 discloses what we call an IPS driving manner. The Patent Documents 15 and 16 disclose PVA driving manners.

In some color filters used for these driving manners, their pixels may be etched into various forms. For example, the inside of their pixel electrode may be etched into the form of strips. A schematic view of a pixel electrode etched into the form of strips in this way is illustrated in FIG. 3. An example of such a pixel electrode is disclosed in, for example, the Patent Document 14.

The pixel electrode may be etched into, for example, a rectangular form, a circular form, or "<-shaped" form. The pixel electrode may be etched into a zigzag form. In recent years, therefore, importance has been attached to the etchable property of the electrode.

ITO, which has been referred to above and has been frequently used at present, is a crystalline material. Thus, in order to etch ITO, a strong acid such as aqua regia is used in many cases. The precision of the etching may be deteriorated by residues from the etching, and further very fine etching lines may not be formed with ease.

In order to improve the etchable property of ITO, which is a drawback thereof, suggested is an indium oxide-zinc oxide based liquid crystal color filter. The electrode material thereof has an improved etchable property but has a problem that the material is lower in electroconductivity than ITO. This matter is descried in the above-mentioned Patent Documents 17, 18 and 19.

In light of the above-mentioned problems, the present invention has been made. An object thereof is to provide a color filter for display having a transparent electrode which is easily etched in the production process thereof, is not easily cracked or peeled in the production process, and further is not easily cracked or peeled with the passage of time after the production thereof, and provide a display device which is stably operated accordingly.

The display herein is typically a liquid crystal display. The color filter of the present invention may be used in any other display. When the above-mentioned display device is a liquid crystal display, its transparent electrode is a liquid-crystal-driving transparent electrode.

In order to attain the above-mentioned objects, the following means are adopted according to the present invention.

First Group Invention

A first group invention for attaining the first object mainly is first described. The first group invention will be described in detail by way of a first embodiment that will be described later. The first group invention can be divided into the following 4 subgroups (1-1, 1-2, 1-3, and 1-4).

1-1 Group (Invention of Amorphous Transparent Electroconductive Film)

(1) The 1-1 group of the present invention relates to an amorphous transparent electroconductive film. An aspect of the 1-1 group of the invention is an amorphous transparent electroconductive film comprising al least indium oxide and zinc oxide, and further comprising one ore more third metals selected from Re, Nb, W, Mo and Zr, wherein the following expressions (1) and (2) are satisfied:

$$0.75 \leq [In]/([In]+[Zn]) \leq 0.95 \ldots \quad (1)$$

$$1.0 \times 10^{-4} \leq [M]/([In]+[Zn]+[M]) \leq 1.0 \times 10^{-2} \quad (2)$$

wherein [In], [Zn] or [M] represents the atomic number of In, that of Zn, or that of the third metal(s), respectively. The atomic number is the number of the In atoms, Zn atoms or third metal atoms per unit volume in the composition of the amorphous transparent electroconductive film.

The atoms of a first metal are indium atoms in the indium oxide, and a second metal is a zinc atom in the zinc oxide.

If the expression (1) is less than 0.75, the transparent electroconductive film does not exhibit a high mobility so that the resistivity thereof may not fall sufficiently. If the value of the expression (1) is more than 0.95, the transparent electroconductive film becomes crystalline so that the etching workability thereof may become a problem. The value of the expression (1) ranges preferably from 0.80 to 0.90, more preferably from 0.82 to 0.90.

In the amorphous transparent electroconductive film of the 1-1 group of the invention, the above-mentioned transparent electroconductive film comprises a third metal. According to the incorporation of the third metal, oxygen is withdrawn from indium oxide so that the resistivity of the transparent electroconductive film falls. If the value of the expression (2) is less than $1.0 \times 10^{-4}$, the resistivity of the transparent electroconductive film may not be sufficiently lowered. If the third metal is added to set the value of the expression (2) over $1.0 \times 10^{-2}$, the advantageous effect may not be obtained. The third metal added in the invention is Re, Nb, W, Mo or Zr.

A preferred value of the expression (2) is varied in accordance with the kind of the third metal. When the third metal is Re, the value is preferably from $1.0 \times 10^{-4}$ to $5.0 \times 10^{-3}$, more preferably from $5.0 \times 10^{-4}$ to $2.0 \times 10^{-3}$. When the third metal is Nb, W or Mo, the value is preferably from $1.0 \times 10^{-3}$ to $1.0 \times 10^{-2}$, more preferably from $2.0 \times 10^{-3}$ to $8.0 \times 10^{-3}$. When the third metal is Zr, the value is preferably from $1.0 \times 10^{-3}$ to $1.0 \times 10^{-2}$, more preferably from $2.0 \times 10^{-3}$ to $8.0 \times 10^{-3}$.

Another invention of the 1-1 group may further comprise tin. The tin content defined by $[Sn]/([In]+[Zn]+[Sn])$ wherein [Sn] is the atomic number of Sn is preferably from $1.0 \times 10^{-2}$ to $9.0 \times 10^{-2}$. The atomic number is the number of the Sn atoms per unit volume in the composition of the amorphous transparent electroconductive film. If tin is incorporated in an amount outside this range ($1.0 \times 10^{-2}$ to $9.0 \times 10^{-2}$), the resistivity of the transparent electroconductive film may become large. A particularly preferred range is from $1.5 \times 10^{-2}$ to $3.0 \times 10^{-2}$.

The amorphous transparent electroconductive film of the 1-1 group can be formed by use of a sputtering target which will be described later.

1-2 Group (Invention of Sputtering Target)

(2) The 1-2 group of the invention relates to a sputtering target of the starting material of the above-mentioned amorphous transparent electroconductive film. An aspect of the 1-2 group of the invention is a sputtering target for the above-mentioned amorphous transparent electroconductive film, comprising indium oxide, zinc oxide, and one ore more third metals selected from Re, Nb, and Zr.

The sputtering target preferably satisfies the following expressions (3) and (4):

$$0.75 \leq [In]/([In]+[Zn]) \leq 0.95 \quad (3)$$

$$1.0 \times 10^{-4} \leq [M]/([In]+[Zn]+[M]) \leq 1.0 \times 10^{-2} \quad (4)$$

wherein [In], [Zn] or [M] represents the atomic number of In, that of Zn, or that of the third metal(s), respectively.

The composition ratio of the amorphous transparent electroconductive film formed by use of a sputtering target is roughly in proportion to the composition ratio of the used sputtering target. Accordingly, if a sputtering target satisfies the expressions (3) and (4), the above-mentioned amorphous transparent electroconductive film can easily be formed. If necessary, tin may be incorporated into the film. In this case, the tin content defined by [Sn]/([In]+[Zn]+[Sn]) wherein [Sn] is the atomic number of Sn is preferably from $1.0 \times 10^{-2}$ to $9.0 \times 10^{-2}$. The tin content is more preferably from $1.5 \times 10^{-2}$ to $3.0 \times 10^{-2}$.

Furthermore, the maximum crystal grain diameter of the zinc oxide in the sputtering target is preferably 5 μm or less. If the maximum crystal grain diameter is more than 5 μm, nodules may be generated at the time of sputtering. The maximum crystal grain diameter is more preferably 3 μm or less.

The maximum crystal grain diameter of zinc oxide means the maximum grain diameter out of grain diameters of zinc oxide which are obtained by measuring any one surface area (30 μm square) in the surface of the sputtering target with an EPMA (electron probe microanalyzer).

The third metal(s) is/are preferably dispersed in the phase of the indium oxide. The wording "is/are dispersed in the phase of the indium oxide" means that no peak originating from the third metal(s) is recognized when the sputtering target is subjected to X-ray structural analysis.

The process for producing the sputtering target may be a known process. For example, the process is a sintering process.

1-3 Group (Invention of Amorphous Transparent Electrode Substrate)

(3) The 1-3 group of the invention relates to an amorphous transparent electrode substrate. An aspect of the 1-3 group of the invention is characterized in that one or more of the amorphous transparent electroconductive films are formed on a substrate.

One out of a plurality of the amorphous transparent electroconductive films may be formed on a substrate. Alternatively, two or more out of the films may be formed on a substrate, the formed films being different from each other in composition. The total thickness of the amorphous transparent electroconductive film(s) formed on the substrate is preferably from 1 to 1000 nm, more preferably from 5 to 500 nm.

The kind of the substrate is not limited. Preferred is a substrate excellent in strength and heat resistance, such as a piece of glass, a heat resistant resin sheet, or a ceramic sheet.

1-4 Group (Invention of Process for Producing Amorphous Transparent Electrode Substrate)

(4) The 1-4 group of the invention relates to a process for producing the amorphous transparent electrode substrate. An aspect of the 1-4 group of the invention is a process for producing the amorphous transparent electrode substrate of the 1-3 group, comprising the step of using anyone sputtering target in the 1-2 group to form the amorphous transparent electroconductive film on a substrate, and the step of heating the amorphous transparent electroconductive film on the substrate up to 200° C. or higher.

When the above-mentioned amorphous transparent electrode substrate is produced, it is advisable that the above-mentioned sputtering target is used to form an amorphous transparent electroconductive film on a substrate by sputtering. In order to lower the resistivity of the amorphous transparent electroconductive film formed on the substrate, the amorphous transparent electroconductive film is preferably heated to 200° C. or higher. The upper limit of the heating temperature is varied in accordance with the heat resistant temperature of the substrate, and is preferably 400° C. or lower. The range of the temperature is more preferably from 230 to 350° C., in particular preferably from 250 to 300° C.

It is preferred that the amorphous transparent electrode substrate is heated in the state that the concentration of oxygen is 0.1% or less by volume. If the amorphous transparent electrode substrate is heated in the state that the concentration of oxygen is over 0.1% by volume, the amorphous transparent electroconductive film may react with oxygen to increase the resistivity of the amorphous transparent electroconductive film. It is more preferred that the film is heated at an oxygen concentration of 0.05% or less by volume. It is also preferred that the film is heated in the state that hydrogen is also present. When the film is heated in the presence of hydrogen, oxygen is withdrawn from the transparent electroconductive film so that the density of carries increases so as to lower the resistivity. The concentration of hydrogen is preferably from 1 to 10% by volume. If the concentration of hydrogen is more than 10% by volume, the amorphous transparent electroconductive film may be colored. If the concentration is less than 1% by volume, sufficient advantageous effects may not be obtained. The concentration of hydrogen is more preferably from 3 to 8% by volume.

Second Group Invention

The following describes a second group invention for attaining the above-mentioned second object mainly. This second group invention will be described in detail by way of a second embodiment that will be described later. The transparent electrode of the second group is substantially equal to the amorphous transparent electroconductive film of the first group. In the second group invention, the amorphous transparent electroconductive film is used as an electrode; thus, attention is paid to the function thereof, whereby the film is called the transparent electrode.

Basic Structure (Type 2A)

In order to attain the above-mentioned object, the color filter for liquid crystal display of the present invention comprises an electrically insulating transparent substrate, a colored layer formed on the electrically insulating transparent substrate, and a transparent electrode formed on the colored layer, and having the following characteristic.

The transparent electrode comprises an amorphous oxide comprising a zinc element and an indium element, and comprises one or more elements selected from Re, Nb, W, Mo and Zr. This structure is called type 2A for convenience' sake.

Basic Structure (Type 2B)

In order to attain the above-mentioned object, the color filter for display of the present invention comprises an electrically insulating transparent substrate, a transparent electrode formed on the electrically insulating transparent substrate, and a colored layer formed on the transparent electrode, wherein the transparent electrode comprises an amorphous oxide comprising a zinc element and an indium element, and comprises one or more elements selected from Re, Nb, W, Mo and Zr. This structure is a structure wherein the position of the transparent electrode of type 2A and that of the colored layer thereof are exchanged for each other. This structure is called type 2B for convenience' sake. These are structures different from each other in form. However, their characteristic structures (materials of their transparent electrodes) are equal to each other.

The color filters based on these basic structures may be used in all displays where a color filter with electrodes are to be used. However, these color filters would be typically used in liquid crystal displays in many cases. When any one of the present color filters is used in a liquid crystal display, the above-mentioned invention is a "color filter for liquid crystal display", and the above-mentioned transparent electrode is a "liquid-crystal-driving transparent electrode".

The following describes the present invention, giving a color filter used mainly in a liquid crystal display as an example.

Electrically Insulating Transparent Substrate

As the electrically insulating transparent substrate, there can be used substrates made of various materials that have been hitherto used for a color filter for liquid crystal display.

Specific examples of the electrically insulating transparent substrate include various electrically insulating transparent glasses such as blue plate glass, white plate glass, non-alkali glass, quartz glass, and borosilicate glass. Other specific examples of the electrically insulating transparent substrate include various electrically insulating polymers such as polycarbonate, polyethersulfone, polyethylene terephthalate, polyarylate, amorphous polyolefin, allyldiglycol carbonate, acrylic resin, epoxy resin, and polyether. Other specific examples of the electrically insulating transparent substrate include products each obtained by coating any one of the above-mentioned electrically insulating transparent glasses with any one of the above-mentioned electrically insulating polymers. The electrically insulating transparent substrate in the invention is not necessarily in a plate form, and may be in a sheet or film form.

Colored Layer

For the colored layer, various colored materials that have been hitherto used for colored layers can be used.

In the same manner as in the prior art, plural colored layers different in spectral transmittance characteristics are appropriately combined and used in accordance with whether the target color filter is a filter for multicolor display or a filter for full color display. Similarly, plural colored layers different in spectral transmittance characteristics are appropriately combined and used in accordance with the kind of a backlight set onto the target color filter used in a liquid crystal display. Respective materials for the colored layers used therefor are appropriately selected in accordance with not only the spectral transmittance characteristics of the target colored layers but also the method for forming the colored layers.

The method for forming the colored layer(s) is not particularly limited, and is appropriately selected from various methods that have been hitherto used, such as dyeing technique, printing technique, dispersing technique, electrodeposition technique and micelle electrolysis technique, in accordance with the precision required for the target color filter, or other factors.

When the colored layer(s) is/are colored by dyeing technique, there are used, for example, a substance wherein a photosensitizer is added to gelatin, casein, polyvinyl alcohol, polyacrylamide or the like, and an acid dye or reactive dye.

When the colored layer(s) is/are formed by printing technique, for example, a substrate wherein a pigment and a dispersion aid are added to a prepolymer or an ink is used.

When the colored layer(s) is/are colored by dispersing technique, there is used, for example, a color resin wherein a coloring agent such as dye, organic pigment or inorganic pigment is dispersed in a transparent photosensitive resin or transparent resin. When the colored layer(s) is/are formed by electrodeposition technique, there is, for example, an electrodepositing solution wherein a coloring agent such as pigment and a polymer are dispersed in a desired solution.

When the colored layer(s) is/are formed by micelle electrolysis technique, there is used, for example, a substance wherein a micelle-producing agent and a hydrophobic coloring matter are dispersed in an aqueous medium having a desired electroconductivity.

When the colored layer(s) is/are formed by electrodeposition technique or micelle electrolysis technique, a transparent electrode is necessary for performing the electrodeposition or the electrolysis. According to these methods, the colored layer(s) is/are formed on the surface of the transparent electrode. In this case, the transparent electrode used to form the colored layer(s) may be used, as it is, as a liquid-crystal-driving electrode. Alternatively, a liquid-crystal-driving electrode may be separately formed on the colored layer(s), as will be described later. In the case where the transparent electrode used to form the colored layer (s) is used, as it is, as a liquid-crystal-driving electrode, a given amorphous oxide that will be described later is used as the material of the electrode. This amorphous oxide is one feature of the present invention, as will be described later.

The colored layer(s) may be a single colored layer. It is also preferred that the colored layer(s) is/are plural layers (in plural colors). The arrangement pattern of the respective colors of the plural colored layers is not particularly limited. In the same manner as in the prior art, the arrangement pattern may be adopted from various arrangement patterns in accordance with the operation mode or the performance of the liquid crystal display wherein the target color filter is used, or other factors. For example, a stripe form, a mosaic form, a triangular form, a 4-pixel arranged form, or the like can be appropriately adopted.

Transparent Electrode

In the color filter for display of the type 2A of the invention, a transparent electrode is formed on the above-mentioned plural colored layers. This transparent electrode comprises an amorphous oxide containing a zinc element and an indium element as its components. When the invention is constructed as a color filter for liquid crystal display, this transparent electrode is rendered a "liquid-crystal-driving transparent electrode".

In the color filter for display of the type 2B of the invention, a transparent electrode is formed on its electrically insulating transparent substrate, and further the above-mentioned colored layer(s) is/are formed thereon. This transparent electrode comprises an amorphous oxide containing a zinc element and an indium element as its components. A typical example of the fact that a material "contains a zinc element and an indium element as its components" is a fact that the material "contains a zinc element and an indium element as main cationic elements". When the invention is constructed as a color filter for liquid crystal display, this transparent electrode is rendered a "liquid-crystal-driving transparent electrode" in the same manner as the type 2A.

Atomic Ratio Between In and Zn

In either of the type 2A or the type 2B, the value of [In]/([Zn]+[In]), which is the atomic ratio between the zinc element and the indium element in this amorphous oxide, is preferably 0.75 or more and less than 0.95. If the atomic ratio is less than 0.75, the oxide becomes crystalline easily. With the crystallization, cracks or creases are easily generated. On the other hand, if the atomic ratio is 0.95 or more, the electroconductivity falls unfavorably. The atomic ratio is more preferably 0.8 or more and less than 0.95, and is even more preferably 0.80 or more and less than 0.9.

Herein, [In] represents the number of the indium atoms per unit mass, and [Zn] represents the number of the indium atoms per unit mass. The same notations are used hereinafter.

Addition of Re, Nb, Zr, W or Mo

As described above, the (liquid-crystal-driving) transparent electrode (amorphous oxide) of the invention is characterized by further comprising one or more elements selected from Re, Nb, Zr, W and Mo as one or more cationic elements other than the zinc element and the indium element. The incorporation of the element(s) makes it possible to improve the electroconductivity of the amorphous oxide ((liquid-crystal-driving) transparent electrode).

However, if the ratio of the total amount of these elements in the total amount of all the cationic elements is more than 1 at % (atomic %), the electroconductivity is easily lowered by ion scattering. Accordingly, the ratio (component ratio) of the total amount of these elements has a preferred numerical range. This range is varied in accordance with each of the elements.

In the case of, e.g., Re, the ratio thereof is preferably 0.0001 or more and 0.005 or less, more preferably 0.0005 or more and 0.005 or less relative to the total amount of all the cationic elements. In the case of Nb, Zr, W and Mo, the ratio thereof is preferably 0.001 or more and 0.01 or less relative to the total amount of all the cationic elements, more preferably 0.002 or more and 0.008 or less relative to the total amount of all the cationic elements.

Other Structures of the invention

Furthermore, another aspect of the invention is characterized in that the transparent electrode (or the liquid-crystal-driving transparent electrode) comprises an amorphous oxide containing a Sn element besides the components of the above-mentioned basic structure (the type 2A and the type 2B).

As described above, when a Sn element is further incorporated into the amorphous oxide which constitutes the transparent electrode (or the liquid-crystal-driving transparent electrode), the electroconductivity is further improved. However, the present inventors' research has demonstrated that when the atomic ratio that is the ratio of contained Sn in the total amount of all the cationic elements is 0.03 or more, the electroconductivity is easily lowered by ion scattering.

For this reason, the ratio (atomic ratio) of contained Sn in the total amount of all the cationic elements is preferably 0.015 or more and less than 0.03. This ratio (atomic ratio) is more preferably 0.018 or more and less than 0.03, even more preferably 0.02 or more and less than 0.028.

The transparent electrode (or the liquid-crystal-driving transparent electrode) comprising the above-mentioned amorphous oxide can be formed:

a. on the above-mentioned plural colored layers, or b. between the above-mentioned electrically insulating transparent substrate and the plural colored layers in the same manner as in the prior art.

However, it is preferred that the electrode is formed on the above-mentioned plural colored layers in order to prevent an increase in the threshold voltage of a display element (for example, a liquid crystal display element), a decline in the sharpness of the rise thereof, or the like. In this case, the electrode may be formed directly on the colored layers. Preferably, the electrode is formed over the colored layers in such a manner that a transparent protective layer is interposed therebetween in order to improve the flatness or smoothness of the transparent electrode or protect the colored layers. This transparent protective layer can be made of an acrylic transparent resin or polyimide transparent resin in the same manner as in the prior art.

Film Thickness of Transparent Electrode

The film thickness of the transparent electrode (or the liquid-crystal-driving transparent electrode) comprising the above-mentioned amorphous oxide is preferably from 30 angstroms to 1 µm. If the thickness is less than 30 angstroms, a sufficient electroconductivity cannot be easily obtained. On the other hand, if the thickness is more than 1 µm, the light transmittance falls easily.

The value of the film thickness is more preferably from 500 to 5000 angstroms, and is in particular preferably from 800 to 4000 angstroms. The shape of this transparent electrode is appropriately selected in accordance with whether the operation mode of the liquid crystal display wherein the target color filter is used or other factors in the same manner as in the prior art.

Shape of Transparent Electrode

For example, in a color filter used in a simple matrix type liquid crystal display or an active matrix type liquid crystal display of a diode system, the transparent electrode is rendered a liquid-crystal-driving transparent electrode made into the form of plural stripes.

In a color filter used in an active matrix type liquid crystal display of a thin film transistor system, the transparent electrode may be rendered a liquid-crystal-driving transparent electrode made of a single film. The transparent electrode may be rendered liquid-crystal-driving transparent electrodes etched corresponding to respective pixels.

In such cases, the liquid-crystal-driving transparent electrode is formed, for example, in any one of the following forms:

a. The electrode is formed into a single film form common to all pixels.

b. The pixel electrode is formed in such a form that the inside of the pixel electrode is etched into a strip form.

c. The pixel electrode is formed in such a form that the inside of the pixel electrode is etched into a rectangular form.

d. The pixel electrode is formed in such a form that the inside of the pixel electrode is etched into a circular form.

e. The pixel electrode is formed in such a form that the inside of the pixel electrode is etched into a "<"-shaped form.

f. The pixel electrode is formed in such a form that the inside of the pixel electrode is etched into a zigzag form.

The transparent electrode etched in this way is generally produced by patterning the transparent electrode film having a desired size by etching technique.

The etching solution used in the etching is aqua regia, which is a mixed solution of nitric acid and hydrochloric acid, an aqueous solution of hydrochloric acid and ferric chloride, an aqueous solution of bromic acid (HBr), a mixed solution of phosphoric acid, acetic acid and nitric acid (PAN based etchant), an aqueous solution of organic acid such as oxalic acid, or the like. Aqua regia, the aqueous solution of hydrochloric acid and ferric chloride, the aqueous solution of bromic acid (HBr) or the like is a strong acid. Accordingly, the acid resistance of the facilities therefor may become necessary. Because of the strong acid, there may be caused a problem of the regeneration of the acid, a problem of transportation for the regeneration of the acid, and other problems. On the other hand, in the case of a weak acid, such problems become smaller than in the case of the strong acid. Thus, the solution thereof and the preparation therefor are easy in many cases. Therefore, etching based on the PAN type or organic weak acid tends to be preferred.

By patterning the pixel area in this way, in particular, a color filter for active matrix liquid crystal display can be suitably constructed.

Formation of Transparent Electrode (or Liquid-crystal-driving Transparent Electrode) by Sputtering Of course, the above-mentioned transparent electrode comprising the amorphous oxide or a transparent electrode film which is a base therefor can be formed by various methods.

However, it is particularly preferred to form the electrode or the film by sputtering using, as a target, a sintered body comprising a hexagonal lamellar compound represented by $In_2O_3(ZnO)m$ wherein m=2-20, preferably m=2-8, and more preferably m=2-6 in order to obtain a highly homogeneous film excellent in adhesiveness while preventing the film from being cracked or peeled.

Used Target

The target may consist essentially of the above-mentioned hexagonal lamellar compound, or may contain indium oxide or zinc oxide besides the hexagonal lamellar compound. However, the purity of the oxide is preferably as high as possible, and is desirably 95% or more.

Furthermore, it is preferred to add, to this target, one or more elements selected from Re, Nb, Zr, W and Mo. In the case of using such a target, a transparent electrode or transparent electrode film having a higher electroconductivity can be obtained. However, if the ratio of the elements (the above-mentioned Re, Nb, Zr, W and Mo elements) added to the finally-obtained transparent electrode or the transparent electrode film is more than 0.01 (atomic ratio) relative to the total amount of all the cationic elements, the electroconductivity is conversely liable to be lowered by ion scattering. For this reason, the dope amount is adjusted in such a manner that the ratio of the dope elements (the above-mentioned Re, Nb, Zr, W and Mo elements) to the finally-obtained transparent electrode or transparent electrode film, the ratio being represented as atomic ratio, is not over 0.01 relative to the total amount of all the cationic elements.

A Sn element may be added to this target. If the ratio of the Sn element in the finally-obtained transparent electrode or transparent electrode film is more than 0.03 relative to the total amount of all the cationic elements, the electroconductivity is conversely liable to be lowered by ion scattering. Accordingly, the dope amount of Sn is adjusted in such a manner that the ratio of the dope element (Sn) in the finally-obtained transparent electrode or transparent electrode film, the ratio being represented as atomic ratio, is not more than 0.03 relative to the total amount of all the cationic elements.

Formation of Target

The above-mentioned target can be obtained, for example, as follows.

Mixing of Materials

First, the following are mixed: indium oxide, or a compound which is converted to indium oxide by firing (for example, indium chloride, indium nitrate, indium acetate, indium hydroxide, or indium alkoxide); and zinc oxide, or a compound which is converted to zinc oxide by firing (for example, zinc chloride, zinc nitrate, zinc acetate, zinc hydroxide, or zinc alkoxide).

At this time, to this mixture is added a metal oxide, hydroxide, alkoxide, chloride, nitrate or acetate which is selected from Re, Nb, Zr, W and Mo if necessary. The use of such a component makes it possible to yield a target which is capable of producing a liquid-crystal-driving transparent electrode containing one or more out of Re, Nb, Zr, W and Mo.

It is also preferred to add, to the mixture, a metal oxide, hydroxide, alkoxide, chloride, nitrate or acetate of Sn. The addition of the compound of Sn makes it possible to yield a target which is capable of producing a liquid-crystal-driving transparent electrode containing Sn.

Firing of Mixed Materials

Next, the thus-yielded mixture is pre-fired at 500 to 120° C. Next, the resultant pre-fired product is pulverized in a ball mill, a roll mill, a pearl mill, a jet mill or the like to yield powder having uniform particle sizes within the range of 0.01 to 5.0 μm.

Before the pulverizing, the pre-fired product may be subjected to reduction treatment at 100 to 800° C. If necessary, the pre-firing and pulverizing of the powder may be repeated. Thereafter, the resultant powder is fashioned into a desired form under pressure. The fashioned product is sintered to 1200 to 1700° C. At this time, polyvinyl alcohol, methylcellulose, polywax or oleic acid may be used as a sintering aid if necessary. A sintered body is yielded in this way, whereby an aimed target can be yielded.

Sputtering using this target may be performed by RF sputtering, DC sputtering or the like. In general, the DC sputtering is industrially preferred from the viewpoint of productivity, or the film property of the resultant film. An example of sputtering conditions for the DC sputtering is as follows.

Specifically, the atmosphere for the sputtering is rendered an inert gas such as argon gas, or a mixed gas of an inert gas and oxygen gas, and the atmosphere pressure at the time of the sputtering is set to about $5\times10^{-2}$ to $1\times10^{-4}$ Torr. The voltage applied to the target is set to 200 to 500 V. If the vacuum degree in the sputtering is less than $5\times10^{-2}$ Torr, the stability of plasma deteriorates. On the other hand, if the vacuum degree is more than $1\times10^{-4}$ Torr, the voltage applied to the target is not easily made high. If the voltage applied to the target is less than 200 V, the film-forming speed is small so that the productivity becomes insufficient. If the voltage is more than 500 V, a good-quality film is not easily obtained. Thus, the above-mentioned conditions are preferred.

The substrate temperature is varied in accordance with the place where the film is to be formed. Specifically, a preferred substrate temperature is varied in accordance with a case wherein the amorphous oxide film is formed directly on the above-mentioned electrically insulating transparent substrate, a case wherein the amorphous oxide film is formed directly on the above-mentioned colored layer(s), a case wherein the amorphous oxide film is formed on the above-mentioned transparent protective layer, or some other cases. In any case, appropriate conditions are set in such a manner that the member which is a base material for the amorphous oxide film is not deformed, denatured or decomposed. For example, in the case where the amorphous oxide film is formed on the transparent protective layer, the substrate temperature is preferably set in the range of room temperature to 300° C. If the temperature is more than 300° C., the colored layer(s) is/are discolored or the transparent protective layer is thermally decomposed with ease. Attention should be paid to the matter that costs for the production become larger as the substrate temperature becomes higher.

The thus-obtained amorphous oxide film has electroconductivity and light transmittance equal to or more than those of ITO films, and further has higher thermal stability and moisture and heat resistance. According to the color filter for display (color filter for liquid crystal display) of the invention having a transparent electrode (liquid-crystal-driving transparent electrode) made of this amorphous oxide film or the amorphous oxide film patterned into a desired shape, produced is an advantageous effect that the transparent electrode for driving (the liquid-crystal-driving transparent electrode) is not easily cracked or peeled in the production process thereof.

Furthermore, the above-mentioned amorphous oxide film has higher thermal stability and moisture and heat resistance than ITO films, as described above; therefore, even after the production of a color filter therefrom, its (liquid-crystal-driving) transparent electrode is not easily cracked or peeled, which is a lasting effect. In short, the transparent electrode has a characteristic that aged deterioration thereof is small.

Light-shielding Layer

In the same manner as in the prior art, the color filter of the invention for liquid crystal display may have a light-shielding layer made of metal chromium, a colored photoresist or the like between two out of the colored layers or on the transparent protective layer in order to prevent a decline in the contrast or color purity based on leak light. This light-shielding layer is formed to be positioned between pixels when the front plane of a color liquid crystal display to which the color filter is fitted is viewed. The shape of the whole thereof is generally a matrix or stripe form.

Structure of Color Liquid Crystal Panel

The color liquid crystal panel using the color filter of the invention for liquid crystal display is constructed by combining this color with an electrically insulating transparent substrate having a transparent electrode having a given shape (referred to as a driving substrate hereinafter). Liquid crystal is filled into the space between the color filter of the invention and this driving substrate. The color filter of the invention and the driving substrate are arranged/positioned to be opposite to each other in such a manner that the space into which desired liquid crystal is sealed is interposed therebetween.

A typical example of the driving substrate has a pixel electrode for driving each pixel, and thin film transistors for applying voltage to this pixel electrode. Signal lines from the longitudinal direction and the lateral direction of the screen are connected to each of the thin film transistors. The thin film transistors for the pixels are individually driven through the signal lines. In this way, each of the pixels is driven.

When the color filter of the invention and the driving substrate are arranged to be opposite to each other, the two are arranged so as to direct each of the electrically insulating transparent substrates thereof outwards. Besides the liquid crystal, spacers made of glass beads or polymer particles are dispersed and arranged between the two. By the action of these spacers, the space between the two is kept to have a given interval. If necessary, an oriented film is arranged on the inner face of each of the color filter and the driving substrate when a liquid crystal panel is constructed.

A color liquid crystal panel referred to herein may be called a color liquid crystal display device, or merely a liquid crystal display device, and may be called a color liquid crystal display, or merely a liquid crystal display.

The color filter of the invention for liquid crystal display can be used in a color liquid crystal display of any one of a direct sight type, a front projection type and a back projection type if the display is a color liquid crystal display wherein a color filter is to be used. Specific examples of the color liquid crystal display include a color liquid crystal display for computer, word processor or device monitor, a liquid crystal color projector, a liquid crystal color television, a liquid crystal color over head projector, a color instrument panel fitted to an automobile, and a large-sized color liquid crystal display such as Color Aurora Vision (trade name).

Also, the color filter of the invention for display is preferably used in displays other than liquid crystal displays.

First Advantageous Effects (in Connection with First Group Invention)

The amorphous transparent electroconductive film of the 1-1 group of the invention has a low resistivity and a large mobility so that the film follows the switching speed of poly Si. Therefore, the film is preferably used for an electrode of a high-speed responsible TFT-LCD, an organic EL, or the like. In particular, the amorphous transparent electroconductive film of the 1-1 group of the invention is excellent in etching-workability and can supply highly minute indicators with a high yield since the film is amorphous.

According to the process of the 1-4 group of the invention for producing an amorphous transparent electroconductive film, this film can be rendered an amorphous transparent electroconductive film having a low resistivity.

In the sputtering target of the 1-2 group of the invention, nodules are hardly generated at the time of sputtering. Consequently, abnormal discharge is hardly caused in the target surface, or alien substrates are hardly generated in the material formed into a film.

Second Advantageous Effects (in Connection with Second Group Invention)

In the color filter of the second group of the invention for display, its liquid-crystal-driving transparent electrode is not easily cracked or peeled in the production process thereof. Furthermore, the liquid-crystal-driving transparent electrode is not easily cracked or peeled with the passage of time after the production. Thus, according to the invention of the present second group, a color filter for display having a higher reliability can be more easily provided.

DETAILED DESCRIPTION OF THE DRAWINGS

BEST MODES FOR CARRYING OUT THE INVENTION

With reference to the drawings, preferred embodiments of the present invention will be specifically described hereinafter.

First Group Embodiments

On the basis of the drawings, preferred first group embodiments of the invention will be described hereinafter. The first group embodiments are embodiments concerned with the invention of the first group. The following will describe nineteen specific examples (Example 1-1 to Example 1-18, and Modified Example 1-1) and six Comparative Examples (Comparative Example 1-1 to 1-6). However, the invention is not limited to the following examples. [In], [Zn], [M] and [Sn] represent the atomic number of In, that of Zn, that of a third metal atom, and that of Sn, respectively. The atomic number is the number of atoms of In, Zn, the third metal or Sn per unit volume in the composition of an amorphous transparent electroconductive film. EPMA is an abbreviation of an electron probe microanalyzer.

X-ray structural analysis was performed using an X-ray structural analyzer (manufactured by Rigaku Denshi (transliteration) Co.). The number of metal atoms was measured with an induced plasma atomic spectrometer (manufactured by Seiko Instruments Ltd.). The maximum crystal grain diameter of zinc oxide was measured by EPMA technique using an EPMA device (manufactured by Hitachi Ltd.). About the transmittance of an amorphous transparent electroconductive film, the transmittance at 550 nm was measured with an automatically-recording spectrometer (Shimadzu Corp.).

EXAMPLE 1-1

Indium oxide and zinc oxide were mixed to set the value of [In]/( [In]+[Zn]), which represents the ratio of the atomic number of In to the atomic number of all the metal atoms, to 0.89, and then the mixture was subjected to wet pulverization to yield powder. This powder was dried, granulated, and then press-molded to yield a molded product. The resultant molded product was heated to 1450° C. so as to be sintered, thereby yielding a sputtering target A four inches square. The density thereof was 6.85 g/cm$^3$.

The maximum crystal grain diameter of zinc oxide in the sputtering target A was 2.8 μm. The X-ray structural analysis of the sputtering target A demonstrated that the target A contained a hexagonal lamellar compound made of $In_2O_3$ $(ZnO)_5$.

Figure 1A:
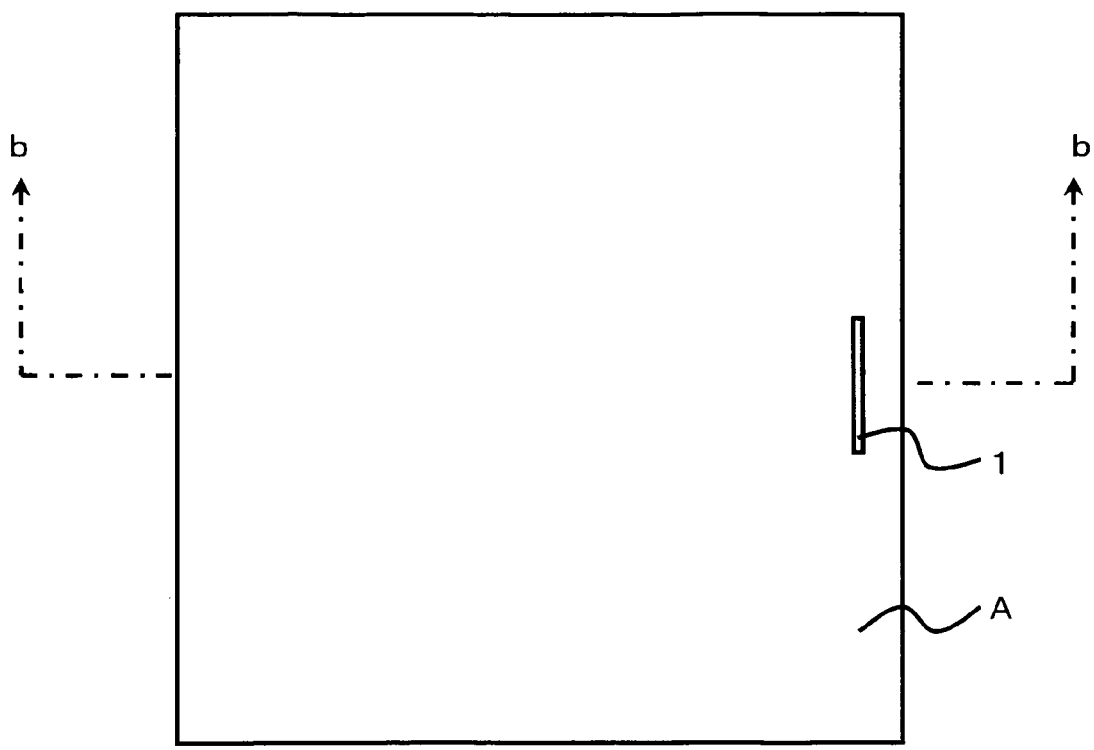
FIG. 1A is a plan view illustrating a state that a wire made of a third metal is put on a sputtering target of a first group of the present embodiment.
Figure 1B:
FIG. 1B is a sectional view illustrating the state that the wire made of the third metal is put on the sputtering target of the first group of the present embodiment.
Figure 2:
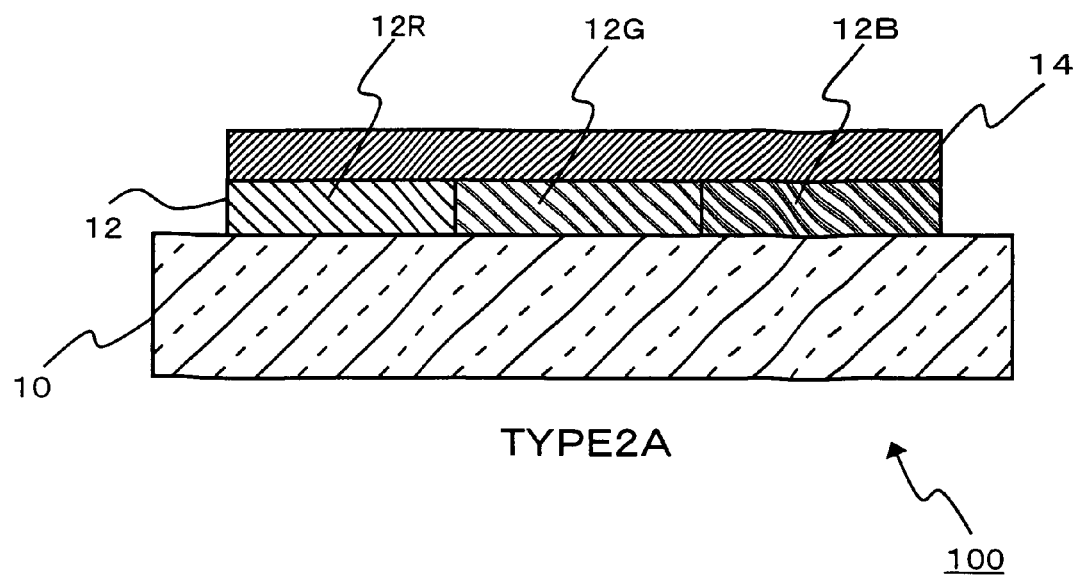
FIG. 2A is a schematic structural view illustrating a basic structure of a color filter, for liquid crystal display, of a second group of the present embodiment.
FIG. 2B is a schematic structural view illustrating another basic structure of the color filter, for liquid crystal display, of the second group of the present embodiment.
Figure 2:
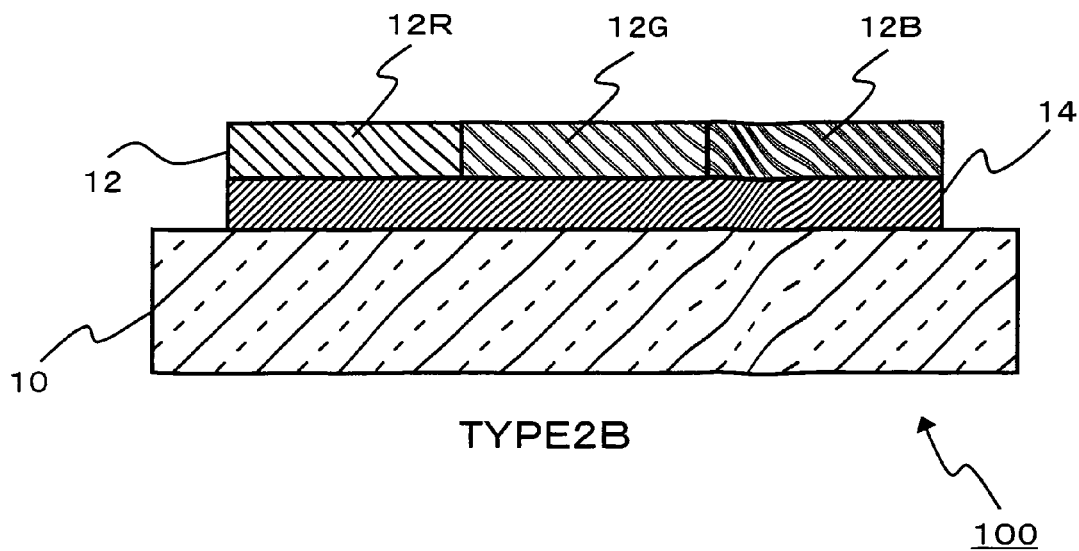
Figure 3:
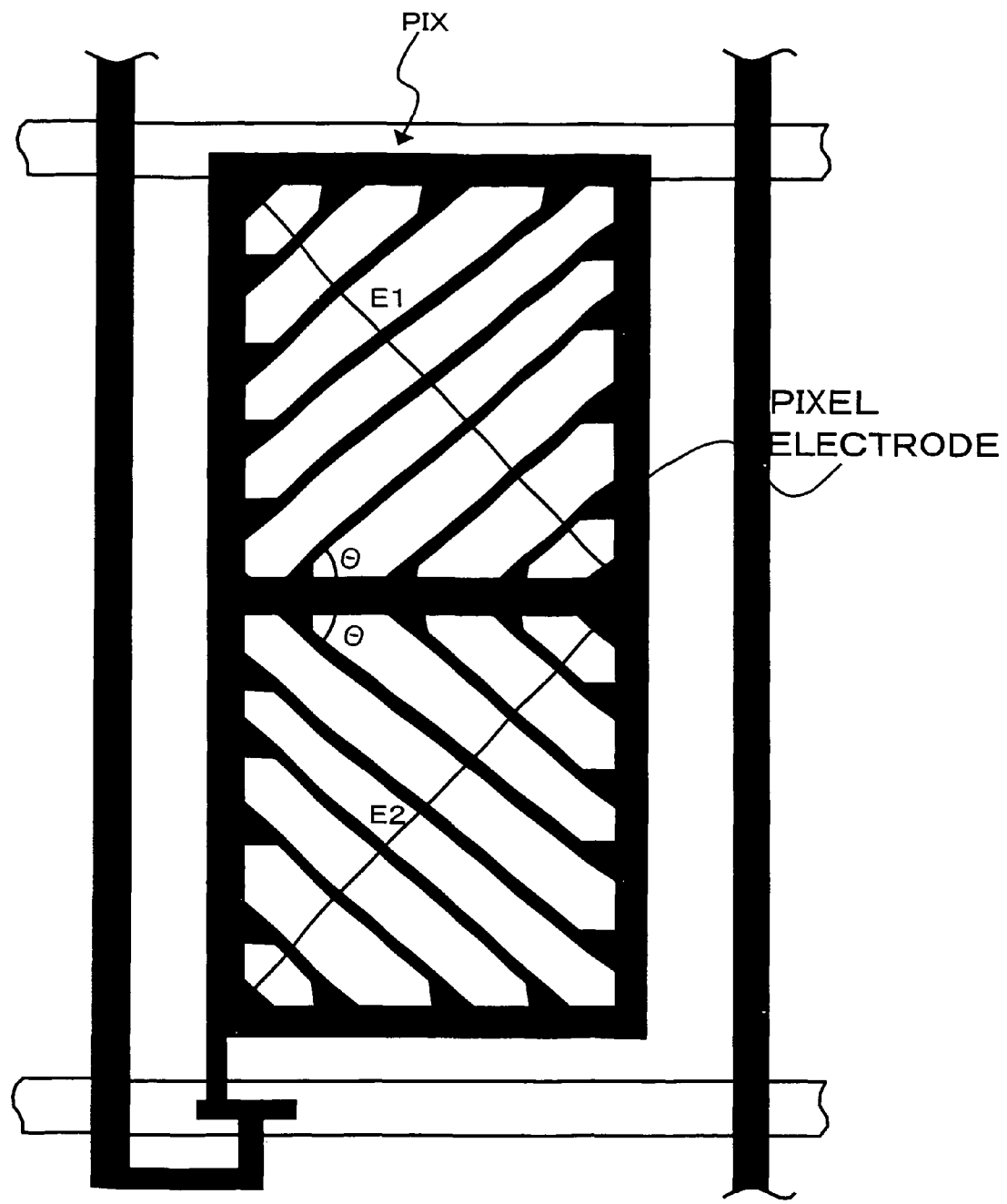
FIG. 3 is a schematic view of a pixel electrode of the second group of the present embodiment, the inside of the electrode being etched into the form of strips.

A glass substrate was set into an RF magnetron sputtering device (manufactured by Shimadzu Corp.), and the temperature of this glass substrate was set to 200° C. As illustrated in FIG. 1, an Re metal wire 1 (diameter: 1 mmφ, and length: 2.5 mm), as a third metal, was put onto an edge portion of the sputtering target A. At a pressure of 0.1 Pa, the target was sputtered so as to form a transparent electroconductive film of 120 nm thickness onto the glass substrate. Next, in the atmosphere of Ar, the glass substrate was heated at 300° C. for 1 hour, thereby producing a transparent electrode substrate wherein the transparent electroconductive film was formed on the glass substrate. FIG. 1A is a plan view illustrating a state that the Re wire 1, as the third metal, was put on the above-mentioned sputtering target, and FIG. 1B is a sectional view along b-b thereof.

In the transparent electroconductive film on the glass substrate, the value of [Re]/([In]+[Zn]+[Re]), which represents the ratio of the atomic number of Re to the atomic number of all the metals, was 0.5×10$^{-3}$. The resistivity, the carrier density, the mobility and the transmittance of this transparent electroconductive film were measured. As a result, they were 219 μΩ·cm, 9.30×10$^{20}$/cm$^3$, 31 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-2

A transparent electroconductive film was produced in the same way as in Example 1-1 except that the Re wire was put onto a central position between the edge portion and the center of the sputtering target. In the transparent electroconductive film on the glass substrate, the value of [Re]/([In]+[Zn]+[Re]), which represents the ratio of the atomic number of Re to the atomic number of all the metals, was 2.3×10$^{-3}$. The resistivity, the carrier density, the mobility and the transmittance of this transparent electroconductive film were measured. As a result, they were 213 μ·Ω·cm, 9.72×10$^{20}$/cm$^3$, 30 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-3

A transparent electroconductive film was produced in the same way as in Example 1-1 except that the Re wire was put onto the center of the sputtering target. In the transparent electroconductive film on the glass substrate, the value of [Re]/([In]+[Zn]+[Re]), which represents the ratio of the atomic number of Re to the atomic number of all the metals, was 3.7×10$^{-3}$. The resistivity, the carrier density, the mobility and the transmittance of this transparent electroconductive film were measured. As a result, they were 225 μ·Ω·cm, 9.00×10$^{20}$/cm$^3$, 31 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-4

A transparent electroconductive film was produced in the same way as in Example 1-1 except that an Nb wire, instead of the Re wire, was put onto the edge portion of the sputtering target. In the transparent electroconductive film on the glass substrate, the value of [Nb]/([In]+[Zn]+[Nb]), which represents the ratio of the atomic number of Nb to the atomic number of all the metals, was 1.4×10$^{-3}$ The resistivity, the carrier density, the mobility and the transmittance of this transparent electroconductive film were measured. As a result, they were 239 μ·Ω·cm, 6.63×10$^{20}$cm$^3$, 40 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-5

A transparent electroconductive film was produced in the same way as in Example 1-4 except that the Nb wire was put onto a central position between the edge portion and the center of the sputtering target. In the transparent electroconductive film on the glass substrate, the value of [Nb]/([In]+[Zn]+[Nb]), which represents the ratio of the atomic number of Nb to the atomic number of all the metals, was $3.6 \times 10^{-3}$. The resistivity, the carrier density, the mobility and the transmittance of this transparent electroconductive film were measured. As a result, they were 229 μ·Ω·cm, $7.41 \times 10^{20}$/cm$^3$, 37 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-6

A transparent electroconductive film was produced in the same way as -in Example 1-4 except that the Nb wire was put onto the center of the sputtering target. In the transparent electroconductive film on the glass substrate, the value of [Nb]/([In]+[Zn]+[Nb]), which represents the ratio of the atomic number of Nb to the atomic number of all the metals, was $4.5 \times 10^{-3}$. The resistivity, the carrier density, the mobility and the transmittance of this transparent electroconductive film were measured. As a result, they were 231 μ·Ω·cm, $7.18 \times 10^{20}$/cm$^3$, 38 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-7

A transparent electroconductive film was produced in the same way as in Example 1-1 except that a Zr wire, instead of the Re wire, was put onto the edge portion of the sputtering target. In the transparent electroconductive film-on the glass substrate, the value of [Zr]/([In]+[Zn]+[Zr]), which represents the ratio of the atomic number of Zr to the atomic number of all the metals, was $4.2 \times 10^{-3}$. The resistivity, the carrier density, the mobility and the transmittance of this transparent electroconductive film were measured. As a result, they were 232 μ·Ω·cm, $8.00 \times 10^{20}$/cm$^3$, 34 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-8

A transparent electroconductive film was produced in the same way as in Example 1-7 except that the Zr wire was put onto a central position between the edge portion and center of the sputtering target. In the transparent electroconductive film on the glass substrate, the value of [Zr]/([In]+[Zn]+[Zr]), which represents the ratio of the atomic number of Zr to the atomic number of all the metals, was $6.4 \times 10^{-3}$. The resistivity, the carrier density, the mobility and the transmittance of this transparent electroconductive film were measured. As a result, they were 235 μ·Ω·cm, $7.90 \times 10^{20}$/cm$^3$, 34 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-9

A transparent electroconductive film was produced in the same way as in Example 1-7 except that the Zr wire was put onto the center of the sputtering target. In the transparent electroconductive film on the glass substrate, the value of [Zr]/([In]+[Zn]+[Zr]), which represents the ratio of the atomic number of Zr to the atomic number of all the metals, was $7.9 \times 10^{-3}$. The resistivity, the carrier density, the mobility and the transmittance of this transparent electroconductive film were measured. As a result, they were 239 μ·Ω·cm, $7.70 \times 10^{20}$/cm$^3$, 35 cm$^2$/V·sec., and 89%, respectively (Table 1-1). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-10

Indium oxide, zinc oxide and tin were mixed to set the value of [In]/([In]+[Zn]), which represents the ratio of the atomic number of In to the atomic number of all the metals, to 0.83 and set the value of [Sn]/([In]+[Zn]+[Sn]), which represents the ratio of the atomic number of Sn to the atomic number thereof, to $1.8 \times 10^{-2}$. This mixture was subjected to wet pulverization to yield powder. The powder was dried, granulated, and press-molded to yield a molded product. The resultant molded product was heated to 1450° C. so as to be sintered, thereby yielding a sputtering target B four inches square. The density thereof was 6.88 g/cm$^3$.

The maximum crystal grain diameter of zinc oxide in the sputtering target B was 2.2 μm. The X-ray structural analysis of the sputtering target B demonstrated that the target B contained a hexagonal lamellar compound made of $In_2O_3(ZnO)_5$.

A glass substrate was set into an RF magnetron sputtering device of the same type as in Example 1-1, and the temperature of this glass substrate was set to 250° C. In the same way as in Example 1-1 except this matter, a transparent electrode substrate wherein a transparent electroconductive film was formed on the glass substrate was produced.

In the transparent electroconductive film on the glass substrate, the value of [Re]/([In]+[Zn]+[Re]), which represents the ratio of the atomic number of Re to the atomic number of all the metals, was $0.5 \times 10^{-3}$. The resistivity, the carrier density, the mobility and the transmittance of this transparent electroconductive film were measured. As a result, they were 185 μ·Ω·cm, $10.20 \times 10^{20}$/cm$^3$, 36 cm$^2$/V·sec., and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-11

A transparent electroconductive film was produced in the same way as in Example 1-10 except that the Re wire was changed to an Nb wire and this Nb wire was put onto a central position between the edge portion and the center of the sputtering target. In the transparent electroconductive film on the glass substrate, the value of [Nb]/([In]+[Zn]+[Nb]), which represents the ratio of the atomic number of Nb to the atomic number of all the metals, was $4.0 \times 10^{-3}$. The resistivity, the carrier density, the mobility and the transmittance of this transparent electroconductive film were measured. As a result, they were 210 $\mu \cdot \Omega \cdot cm$, $10.50 \times 10^{20}/cm^3$, $31 cm^2/V \cdot sec.$, and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-12

A transparent electroconductive film was produced in the same way as in Example 1-10 except that the Re wire was changed to a Zr wire and this Zr wire was put onto a central position between the edge portion and the center of the sputtering target. In the transparent electroconductive film on the glass substrate, the value of [Zr]/([In]+[Zn]+[Zr]), which represents the ratio of the atomic number of Zr to the atomic number of all the metals, was $6.5 \times 10^{-3}$. The resistivity, the carrier density, the mobility and the transmittance of this transparent electroconductive film were measured. As a result, they were 208 $\mu \cdot \Omega \cdot cm$, $9.97 \times 10^{20}/cm^3$, 30 $cm^2/V \cdot sec.$, and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-13

Indium oxide, zinc oxide and tin were mixed to set the value of [In]/([In]+[Zn]), which represents the ratio of the atomic number of In to the atomic number of all the metals, to 0.83 and set the value of [Sn]/([In]+[Zn]+[Sn]), which represents the ratio of the atomic number of Sn to the atomic number thereof, to $2.8 \times 10^{-2}$. This mixture was subjected to wet pulverization to yield powder. The powder was dried, granulated, and press-molded to yield a molded product. The resultant molded product was heated to 1450° C. so as to be sintered, thereby yielding a sputtering target C four inches square. The density thereof was 6.88 $g/cm^3$.

The maximum crystal grain diameter of zinc oxide in the sputtering target C was 2.1 μm. The X-ray structural analysis of the sputtering target C demonstrated that the target C contained a hexagonal lamellar compound made of $In_2O_3(ZnO)_5$.

Sputtering was performed using the resultant sputtering target C instead of the sputtering target B in Example 1-10. In the same way as in Example 1-10 except this matter, a transparent electrode substrate wherein a transparent electroconductive film was formed on the glass substrate was produced.

In the transparent electroconductive film on the glass substrate, the value of [Re]/([In]+[Zn]+[Re]), which represents the ratio of the atomic number of Re to the atomic number of all the metals, was $0.5 \times 10^{-3}$ The resistivity, the carrier density, the mobility and the transmittance of this transparent electroconductive film were measured. As a result, they were 186 $\mu \cdot \Omega \cdot cm$, $10.20 \times 10^{20}/cm^3$, 36 $cm^2/V \cdot sec.$, and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-14

A transparent electroconductive film was produced in the same way as in Example 1-13 except that the Re wire was changed to an Nb wire and this Nb wire was put onto a central position between the edge portion and the center of the sputtering target. In the transparent electroconductive film on the glass substrate, the value of [Nb]/([In]+[Zn]+[Nb]), which represents the ratio of the atomic number of Nb to the atomic number of all the metals, was $4.1 \times 10^{-3}$. The resistivity, the carrier density, the mobility and the transmittance of this transparent electroconductive film were measured. As a result, they were 212 $\mu \cdot \Omega \cdot cm$, $10.00 \times 10^{20}/cm^3$, $30 cm^2/V \cdot sec.$, and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-15

A transparent electroconductive film was produced in the same way as in Example 1-13 except that the Re wire was changed to a Zr wire and this Zr wire was put onto a central position between the edge portion and the center of the sputtering target. In the transparent electroconductive film on the glass substrate, the value of [Zr]/([In]+[Zn]+[Zr]), which represents the ratio of the atomic number of Zr to the atomic number of all the metals, was $6.7 \times 10^{-3}$. The resistivity, the carrier density, the mobility and the transmittance of this transparent electroconductive film were measured. As a result, they were 216 $\mu \cdot \Omega \cdot cm$, $7.80 \times 10^{20}/cm^3$, $36 cm^2/V \cdot sec.$, and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-16

A transparent electroconductive film was produced in the same way as in Example 1-10 except that the Re wire was changed to a W wire and this W wire was put onto a central position between the edge portion and the center of the sputtering target. In the transparent electroconductive film on the glass substrate, the value of [W]/([In]+[Zn]+[W]), which represents the ratio of the atomic number of W to the atomic number of all the metals, was $1.3 \times 10^{-3}$ The resistivity, the carrier density, the mobility and the transmittance of this transparent electroconductive film were measured. As a result, they were 213 $\mu \cdot \Omega \cdot cm$, $9.70 \times 10^{20}/cm^3$, $30 cm^2/V \cdot sec.$, and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-17

A transparent electroconductive film was produced in the same way as in Example 1-10 except that the Re wire was changed to an Mo wire and this Mo wire was put onto a central position between the edge portion and the center of the sputtering target. In the transparent electroconductive film on the glass substrate, the value of [Mo]/([In]+[Zn]+[Mo]), which represents the ratio of the atomic number of Mo to the atomic number of all the metals, was $4.2 \times 10^{-3}$. The resistivity, the carrier density, the mobility and the transmittance of this transparent electroconductive film were measured. As a result, they were 215 $\mu \cdot \Omega \cdot cm$, $9.20 \times 10^{20}/cm^3$, $32 cm^2/V \cdot sec$., and 90%, respectively (Table 1-2). The transparent electroconductive film was subjected to X-ray structural analysis. As a result, it was found out that the film was amorphous. In other words, the resultant transparent electroconductive film was an amorphous transparent electroconductive film having a low resistance.

EXAMPLE 1-18

Indium oxide, zinc oxide, tin and Re were mixed to set the value of [In]/([In]+[Zn]), which represents the ratio of the atomic number of In to the atomic number of all the metals, to 0.83, set the value of [Sn]/([In]+[Zn]+[Sn]), which represents the ratio of the atomic number of Sn to the atomic number thereof, to $2.5 \times 10^{-2}$, and set the value of [Re]/([In]+[Zn]+[Re]), which represents the ratio of the atomic number of Re to the atomic number thereof, to $0.1 \times 10^{-4}$. This mixture was subjected to wet pulverization to yield powder. The powder was dried, granulated, and press-molded to yield a molded product. The resultant molded product was heated to 1450° C. so as to be sintered, thereby yielding a sputtering target D four inches square. The density thereof was 6.89 g/cm³.

The maximum crystal grain diameter of zinc oxide in the sputtering target D was 2.3 μm. The X-ray structural analysis of the sputtering target D demonstrated that the target D contained a hexagonal lamellar compound made of $In_2O_3(ZnO)_5$. At this time, no peak originating from the Re metal was recognized.

A glass substrate was set into an RF magnetron sputtering device of the same type as in Example 1-1, and the temperature of this glass substrate was set to 250° C. Sputtering was performed using the sputtering target D produced as described above at a pressure of 0.1 Pa, so as to form a transparent electroconductive film of 120 nm thickness on the glass substrate. Next, the glass substrate was heated at 250° C. in the atmosphere of Ar for 1 hour. In this way, a transparent electrode substrate, wherein the transparent electroconductive film was formed on the glass substrate, was produced.

The resistivity, the carrier density, the mobility and the transmittance of this transparent electroconductive film on the glass substrate were measured. As a result, they were 183 $\mu \cdot \Omega \cdot cm$, $10.5 \times 10^{20}/cm^3$, $37 cm^2/V \cdot sec$., and 90%, respectively. The transparent electroconductive film was subjected to X-ray structural analysis. As a result, it was found out that the film was amorphous. In other words, the resultant transparent electroconductive film was an amorphous transparent electroconductive film having a low resistance.

A new sputtering target D which was different from the above-mentioned sputtering target D was used to perform sputtering continuously under the above-mentioned conditions for 50 hours. As a result, no abnormal discharge was caused. No nodules were generated in the surface of this sputtering target D, which was used in the 50-hour sputtering.

MODIFIED EXAMPLE 1-1

In the above-mentioned Examples 1-1 to 1-18, the thermal treatment steps for the amorphous transparent electroconductive films were conducted in the atmosphere of Ar. Needless to say, in the Ar atmosphere, the concentration of oxygen was 0.1% or less by volume. The present invention is not limited thereto, and thus the amorphous transparent electroconductive films may be subjected to thermal treatment in the presence of hydrogen also. It is preferred that the concentration of hydrogen, which is present together, is from 1 to 10% by volume.

COMPARATIVE EXAMPLE 1-1

Sputtering was performed without putting the Re wire of Example 1-1 onto the sputtering target A. In the same way as in Example 1-1 except this matter, a transparent electrode substrate wherein a transparent electroconductive film was formed on a glass substrate was produced.

The resistivity, the carrier density, the mobility and the transmittance of this transparent electroconductive film on the glass substrate were measured. As a result, they were 350 $\mu \cdot \Omega \cdot cm$, $9.20 \times 10^{20}/cm^3$, $19 cm^2/V \cdot sec$., and 89%, respectively (Table 1-1). The transparent electroconductive film was subjected to X-ray structural analysis. As a result, it was found out that the film was amorphous. However, the resistivity of the resultant amorphous transparent electroconductive film was higher than that of the amorphous transparent electroconductive film of Example 1-1.

COMPARATIVE EXAMPLE 1-2

A transparent electroconductive film was produced in the same way as in Example 1-1 except that an Re wire was put onto an erosion of the sputtering target A. The resistivity, the carrier density, the mobility and the transmittance of this transparent electroconductive film on the glass substrate were measured. As a result, they were 263 $t\mu \cdot \Omega \cdot cm$, $6.57 \times 10^{20}/cm^3$, $37 cm^2/V \cdot sec$., and 87%, respectively (Table 1-1). The transparent electroconductive film was subjected to X-ray structural analysis. As a result, it was found out that the film was amorphous.

COMPARATIVE EXAMPLE 1-3

A transparent electroconductive film was produced in the same way as in Comparative Example 1-2 except that the Re wire was changed to an Nb wire. The resistivity, the carrier density, the mobility and the transmittance of this transparent electroconductive film on the glass substrate were measured. As a result, they were 266 $\mu \cdot \Omega \cdot cm$, $6.69 \times 10^{20}/cm^3$, $35 cm^2/V \cdot sec$., and 88%, respectively (Table 1-1). The transparent electroconductive film was subjected to X-ray structural analysis. As a result, it was found out that the film was amorphous.

COMPARATIVE EXAMPLE 1-4

A transparent electroconductive film was produced in the same way as in Comparative Example 1-2 except that the Re wire was changed to a Zr wire. The resistivity, the carrier density, the mobility and the transmittance of this transparent electroconductive film on the glass substrate were measured. As a result, they were 268 μ·Ω·cm, 7.78×10$^{20}$/cm$^3$, 29 cm$^2$/V·sec., and 89%, respectively (Table 1-1). The transparent electroconductive film was subjected to X-ray structural analysis. As a result, it was found out that the film was amorphous.

COMPARATIVE EXAMPLE 1-5

Sputtering was performed without putting the Re wire of Example 1-10 onto a sputtering target. In the same way as in Example 1-10 except this matter, a transparent electroconductive film was produced. The resistivity, the carrier density, the mobility and the transmittance of this transparent electroconductive film on the glass substrate were measured. As a result, they were 328 μ·Ω·cm, 6.43×10$^{20}$/cm$^3$, 29.6 cm$^2$/V·sec., and 89%, respectively (Table 1-2). The transparent electroconductive film was subjected to X-ray structural analysis. As a result, it was found out that the film was amorphous.

COMPARATIVE EXAMPLE 1-6

Wet pulverization was performed in the state that the value of [Re]/([In]+[Zn]+[Re]), which represents the ratio of the atomic number of Re to the atomic number of all the metals in Example 1-18, was set to 1.5×10$^{-2}$. In the same way as in Example 1-18 except this matter, a sputtering target E four inches square was produced, the density thereof being 6.86 g/cm$^3$.

The maximum crystal grain diameter of zinc oxide in the sputtering target E was 2.2 μm. The X-ray structural analysis of the sputtering target E demonstrated that the target E contained a hexagonal lamellar compound made of $In_2O_3(ZnO)_5$.

Sputtering was performed using the sputtering target E instead of the sputtering target D of Example 1-18. In the same way as in Example 1-18 except this matter, a transparent electroconductive substrate wherein a transparent electroconductive film was formed on a glass substrate was produced.

The resistivity, the carrier density, the mobility and the transmittance of this transparent electroconductive film on the glass substrate were measured. As a result, they were 263 μ·Ω·cm, 6.57×10$^{20}$/cm$^3$, 37 cm$^2$/V·sec., and 87%, respectively. The transparent electroconductive film was subjected to X-ray structural analysis. As a result, it was found out that the film was amorphous. However, the resistivity of the resultant amorphous transparent electroconductive film was higher than that of the amorphous transparent electroconductive film of Example 1-1.

Another new sputtering target E was used to perform sputtering continuously under the above-mentioned conditions for 50 hours. As a result, abnormal discharge was caused. Nodules were observed in the surface of the sputtering target E after the end of the sputtering.

TABLE 1-1

| No. | Target [In]/([In] + [Zn]) | Third metal | [M]/([In] + [Zn] + [M]) | Resistivity (μ·Ω·cm) | Carrier density (×10$^{20}$/cm$^3$) | Mobility (cm$^2$/V·sec) | Transmittance*) (%) |
|---|---|---|---|---|---|---|---|
| Example 1-1 | 0.89 | Re | 0.5 × 10$^{-3}$ | 219 | 9.30 | 31 | 89 |
| Example 1-2 | | | 2.3 × 10$^{-3}$ | 213 | 9.72 | 30 | 89 |
| Example 1-3 | | | 3.7 × 10$^{-3}$ | 225 | 9.00 | 31 | 89 |
| Example 1-4 | | Nb | 1.4 × 10$^{-3}$ | 239 | 6.63 | 40 | 89 |
| Example 1-5 | | | 3.6 × 10$^{-3}$ | 229 | 7.41 | 37 | 89 |
| Example 1-6 | | | 4.5 × 10$^{-3}$ | 231 | 7.18 | 38 | 89 |
| Example 1-7 | | Zr | 4.2 × 10$^{-3}$ | 232 | 8.00 | 34 | 89 |
| Example 1-8 | | | 6.4 × 10$^{-3}$ | 235 | 7.90 | 34 | 89 |
| Example 1-9 | | | 7.9 × 10$^{-3}$ | 239 | 7.70 | 35 | 89 |
| Comparative Example 1-1 | 0.89 | — | 0 | 350 | 9.20 | 19 | 89 |
| Comparative Example 1-2 | | Re | 1.5 × 10$^{-2}$ | 263 | 6.57 | 37 | 87 |
| Comparative Example 1-3 | | Nb | 2.5 × 10$^{-2}$ | 266 | 6.69 | 35 | 88 |
| Comparative Example 1-4 | | Zr | 2.1 × 10$^{-2}$ | 268 | 7.78 | 29 | 89 |

*)Transmittance at a wavelength of 550 nm

TABLE 1-2

| No. | Target [In]/([In] + [Zn]) | [Sn]/([In] + [Zn] + [Sn]) | Third metal | [M]/([In] + [Zn] + [M]) | Resistivity (μ·Ω·cm) | Carrier density (×10$^{20}$/cm$^3$) | Mobility (cm$^2$/V·sec) | Transmittance*) (%) |
|---|---|---|---|---|---|---|---|---|
| Example 1-10 | 0.83 | 1.8 × 10$^{-2}$ | Re | 0.5 × 10$^{-3}$ | 185 | 10.20 | 38 | 90 |
| Example 1-11 | | | Nb | 4.0 × 10$^{-3}$ | 210 | 10.50 | 31 | 90 |
| Example 1-12 | | | Zr | 6.5 × 10$^{-3}$ | 208 | 9.97 | 30 | 90 |

TABLE 1-2-continued

Table 1-2

| | | | | | Amorphous transparent electroconductive film | | | |
|---|---|---|---|---|---|---|---|---|
| No. | Target [In]/([In] + [Zn]) | [Sn]/([In] + [Zn] + [Sn]) | Third metal | [M]/([In] + [Zn] + [M]) | Resistivity ($\mu \cdot \Omega \cdot cm$) | Carrier density ($\times 10^{20}/cm^3$) | Mobility ($cm^2/V \cdot sec$) | Transmittance*) (%) |
| Example 1-13 | | $2.8 \times 10^{-2}$ | Re | $0.5 \times 10^{-3}$ | 186 | 10.20 | 36 | 90 |
| Example 1-14 | | | Nb | $4.1 \times 10^{-3}$ | 212 | 10.00 | 30 | 90 |
| Example 1-15 | | | Zr | $6.7 \times 10^{-3}$ | 216 | 7.80 | 36 | 90 |
| Example 1-16 | | $1.8 \times 10^{-2}$ | W | $1.3 \times 10^{-3}$ | 213 | 9.70 | 30 | 90 |
| Example 1-17 | | | Mo | $4.2 \times 10^{-3}$ | 215 | 9.20 | 32 | 90 |
| Comparative Example 15 | | $1.8 \times 10^{-2}$ | — | 0 | 328 | 6.43 | 29.6 | 89 |

*)Transmittance at a wavelength of 550 nm

Second Group Embodiments

On the basis of the drawings, preferred second group embodiments of the invention will be described hereinafter. The second group embodiments are embodiments concerned with the invention of the second group. The following will describe ten specific examples (Examples 2-1 to 2-10 and six Comparative Examples (Comparative Examples 2-1 to 2-6).

In the following description, color filters for liquid crystal displays are mainly described. Examples wherein their transparent electrode is a liquid-crystal-driving transparent electrode are described. Of course, however, the color filter of the invention for display can be applied to various displays each using a color filter with electrodes.

The liquid-crystal-driving transparent electrodes in the second group embodiments are substantially equivalent to the amorphous transparent electroconductive films in the first group embodiments. In each of the second group embodiments, an amorphous transparent electroconductive film is used as an electrode; thus, attention is paid to the function thereof, whereby the film is called the liquid-crystal-driving transparent electrode.

EXAMPLE 2-1

In Example 2-1, there is described an example of a color filter for liquid crystal display wherein an electrically insulating transparent substrate, colored layers, and a liquid-crystal-driving transparent electrode are laminated in this order.

(1) Formation of Colored Layer

Prepared was a product wherein an ITO film having a surface resistance of 20 $\Omega$/□ was formed on a glass substrate as an electrically insulating transparent substrate (manufactured by Geomatec Co., the glass substrate being a blue glass having a polished surface (silica dip product)). According to the following steps (a) to (d), colored layers were formed by micelle electrolysis technique.

(a) Formation of ITO Electrode for Electrolysis by Photolithography

An ultraviolet curable resist agent (FH22130, manufactured by Fuji-Hunt Electronics Technology Co., Ltd.) was applied onto the ITO film by spin coating at a rotation speed of 1000 rpm. After the spin coating, the resultant was pre-baked at 80° C. for 15 minutes. Thereafter, the ITO-glass substrate, wherein the resist film was formed, was set to an exposure device. The mask adopted therein had a longitudinal pattern of 1920 stripes having a line width of 90 μm, a gap of 20 μm and a line length of 230 mm.

The used light source was a 2-kw high-pressure mercury lamp. A proximity gap of 70 μm was adopted, and the resist film was exposed to light at 120 mJ/cm². Thereafter, the resultant was developed with a developing solution (FHD-5, manufactured by Fuji-Hunt Electronics Technology Co., Ltd.) to pattern the resist pattern into a given form. After the development, the resultant was rinsed with pure water, and then post-baked at 180° C.

Next, a 1 M solution of $FeCl_3$, 6N HCl, 0.1 N $HNO_3$ and 0.1 N $Ce(NO_3)_4$ in water was prepared as an etching solution, and the above-mentioned resist film patterned into the given form was used as a mask to etch the ITO film with the etching solution for about 20 minutes. The end of the etching was decided on the basis of measured results of the electric resistance. This is because the electric resistance changes remarkably when the etching ends.

After the end of the etching, the resultant was rinsed with pure water, and subsequently the resist film was peeled with 1N NaOH. In this way, a stripe-form ITO electrode for electrolysis was formed on the glass substrate. The glass substrate having the ITO electrode for electrolysis will be called the "ITO-patterned glass substrate" hereinafter. This ITO electrode for electrolysis was used, and micelle electrolysis technique was applied thereto, thereby forming colored layers, which will be described later.

(b) Formation of Light-shielding Layer

As a resist agent for light-shielding layer formation, there was used a mixture wherein color mosaics CK, CR, CG and CB, manufactured by Fuji-Hunt Electronics Technology Co., Ltd., were mixed at a ratio (weight ratio) of 3/1/1/1. The ITO-patterned glass substrate formed in the step (a) was rotated at 10 rpm. The resist agent for light-shielding layer formation was sprayed in an amount of 30 cc onto this substrate. Next, the rotation number (the rotation number of the ITO-patterned glass substrate) for the spin coating was set to 500 rpm so as to form a homogeneous resist film on the ITO-patterned glass substrate. After the spin coating, the resultant was pre-baked at 80° C. for 15 minutes.

Thereafter, while an exposure device having an alignment function was used to carry out given alignment, a mask having a given design (90×310 mm rectangles, line width: 20 μm) was used to expose the resist film to light. The used light source was a 2 kw high-pressure mercury lamp. A proximity gap of 70 μm was adopted, and the resist film was exposed to light at 100 mJ/cm². Thereafter, the resultant was developed with a developing solution (a product wherein a Fuji Hunt CD, manufactured by Fuji-Hunt Electronics Technology Co., Ltd., was diluted 4 times with pure water) for 30 seconds, so as to pattern the resist film into a given form. After the development, the resultant was rinsed with pure water, and then post-baked at 200° C. for 100 minutes. In this way, a light-shielding layer made of the above-mentioned resist film and having a given shape (thickness: 1.1 μm) was formed. The product wherein the light-shielding layer was formed on the ITO-patterned glass substrate will be referred to as the "glass substrate with the light-shielding layer" hereinafter.

(c) Preparation of Dispersion for Micelle Electrolysis

As a dispersion for forming a colored layer having a high spectral transmittance in a red wavelength range (referred to as the "R colored layer" hereinafter), a dispersion (dispersing medium: pure water) of Chromo Phthal Red A2B (manufactured by Ciba-Geigy Japan Limited) was used. A dispersion for forming a colored layer having a high spectral transmittance in a green wavelength range (referred to as the "G colored layer" hereinafter) was prepared by mixing a dispersion (dispersing medium: pure water) of Heliogen (transliteration) Green L9361 (manufactured by BASF Co.) and a dispersion (dispersing medium: pure water) of Irgazine (transliteration) Yellow 2RLT (manufactured by Ciba-Geigy Japan Limited) with each other at a ratio (weight ratio) of 70/30 while keeping each of the dispersions at 20° C., and further dispersing the mixed solution with an ultrasonic homogenizer for 30 minutes. A dispersion for forming a colored layer having a high spectral transmittance in a blue wavelength range (referred to as the "B colored layer" hereinafter) was prepared by mixing a dispersion (dispersing medium: pure water) of Fastgen (transliteration) Blue TGR (manufactured by Dainippon Ink & Chemicals, Inc.) and Fastgen (transliteration) Supper Violet 2RN (manufactured by Dainippon Ink & Chemicals, Inc.) with each other at a ratio (weight ratio) of 80/20 while keeping each of the dispersions at 20° C.

(d) Micelle Electrolysis

The glass substrate with the light-shielding layer, produced in the steps (a) and (b), was first immersed into the R colored layer forming dispersion (liquid temperature: 20° C.) prepared in the above-mentioned step (c). A potentiostat was connected to the ITO electrode for electrolysis (the electrode for micelle electrolysis) at its site where an R colored layer was to be formed, and then the glass substrate was subjected to constant-potential electrolysis at 0.5V vs. SCE for 25 minutes to yield the R colored layer. After the micelle electrolysis, the resultant was rinsed with pure water, and subsequently baked at 100° C. for 15 minutes.

Next, this substrate was immersed into the G colored layer forming dispersion (liquid temperature: 20° C.) prepared in the above-mentioned step (c). A potentiostat was connected to the ITO electrode for electrolysis at its site where a G colored layer was to be formed, and then the glass substrate was subjected to constant-potential electrolysis at 0.5V vs. SCE for 20 minutes to yield the G colored layer. After the micelle electrolysis, the resultant was rinsed with pure water, and subsequently baked at 100° C. for 15 minutes.

Lastly, this substrate was immersed into the B colored layer forming dispersion (liquid temperature: 20° C.) prepared in the above-mentioned step (c). A potentiostat was connected to the ITO electrode for electrolysis at its site where a B colored layer was to be formed, and then the glass substrate was subjected to constant-potential electrolysis at 0.5V vs. SCE for 15 minutes to yield the B colored layer. After this micelle electrolysis, the resultant was rinsed with pure water, and subsequently baked at 100° C. for 15 minutes.

In this way, the R colored layer, the G colored layer and the B colored layer were formed in the form of alternately-arranged stripes. The glass substrate having the R cored layer, the G colored layer and the B colored layer will be referred to as the "glass substrate with the colored layers" hereinafter.

(2) Formation of Transparent Protective Layer

The glass substrate with the colored layers, yielded in the (1), was set onto a spin coater. A dispenser was used to apply a polysiloxane resin (OS-808 manufactured by Nagase & Co., Ltd.), as a transparent protective layer material, onto the colored layers. At this time, this glass substrate with the colored layers was slowly rotated at 10 rpm, thereby applying the resin evenly onto the entire surface of the glass substrate with the colored layers. Furthermore, the glass substrate with the colored layers was rotated at 800 rpm for 1 minute to yield a homogeneous resin thin film. Thereafter, the resultant was baked at 260° C. for 2 hours to cure the resin. In this way, a transparent protective layer was yielded.

(3) Formation of Liquid-crystal-driving Transparent Electrode

The "glass substrate with the colored layers on which the transparent protective layer was formed", the substrate being produced in the (2), was set up to a DC magnetron direct sputtering machine, and the pressure in its vacuum chamber was reduced to $1 \times 10^{-6}$ Torr or less. Thereafter, argon gas having a purity of 99.99% was introduced into the chamber up to $3 \times 10^{-3}$ Torr.

A sintered body target composed of a hexagonal lamellar compound represented by $In_2O_3(ZnO)_5$, indium oxide ($In_2O_3$) and rhenium oxide ($ReO_3$) (ICP elementary analysis values in a thin film thereof: $[In]/([In]+[Zn])=0.89$, and $[Re]/([In]+[Zn]+[Re])=0.0005$) was used to perform sputtering at a target applied voltage of 420 V and a substrate temperature of 200° C.

In particular, in the above-mentioned expressions, [In] represents the number of the indium atoms in unit mass, [Zn] represents the number of the zinc atoms in unit mass, and [Re] represents the number of the rhenium atoms in unit mass (this matter is the same in the following description). In other words, the above-mentioned expressions each represent the ratio between the atoms. In the present patent, the number of atoms is represented in this way hereinafter.

According to this sputtering, the following was formed on the transparent protective layer: a liquid-crystal-driving transparent electrode which was made of an amorphous oxide film containing zinc and indium elements as main cationic elements and had a thickness of about 0.12 μm. In this way, a target color filter for liquid crystal display was yielded. This color filter is suitable as a color filter for active matrix type liquid crystal display of a thin film transistor type.

The surface resistance of the thus-yielded color filter for liquid crystal display (the liquid-crystal-driving transparent electrode) was 18 Ω/□. This color filter for liquid crystal display was not recognized as a deformed color filter, and exhibited a good external appearance. About the liquid-crystal-driving transparent electrode in this color filter for liquid crystal display, a tape peeling test based on a checked board test was made, and further there were measured: the moisture and heat resistance thereof (after the electrode was allowed to stand at 60° C. and a relative humidity of 90% for 24 hours, the generation of cracks, creases or peeling was observed with the naked eye or a magnifying glass); and the heat resistance thereof (after the electrode was allowed to stand at 250° C. for 2 hours, the generation of cracks, creases or peeling was observed with the naked eye or a magnifying glass) were measured.

Furthermore, the electrode was etched (line/space: 2 μm/2 μm) with a 3% by weight solution of oxalic acid in water, and subsequently the shape of the electrode and etching residues thereon were observed with a scanning electron microscope (scanning electron microscope manufactured by JEOL Ltd.). The results are shown in Table 2-1.

It was ascertained that the liquid-crystal-driving transparent electrode was amorphous from the measurement result obtained by forming a transparent electrode directly onto a glass substrate under the same conditions as in the (3) and then subjecting this transparent electrode to X-ray analysis.

EXAMPLE 2-2

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_4$, indium oxide ($In_2O_3$) and rhenium oxide ($ReO_3$) (ICP elementary analysis values in a thin film thereof: $[In]/([In]+[Zn])=0.83$, and $[Re]/([In]+[Zn]+[Re])=0.0035$) was used. The surface resistance of the thus-yielded color filter for liquid crystal display (the surface resistance of the liquid-crystal-driving transparent electrode) was 19 Ω/□.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-2 was made of amorphous oxide on the basis of the measurement result of X-ray analysis of a transparent electrode formed directly onto a glass substrate under the same conditions as in the present Example 2-2.

EXAMPLE 2-3

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$) and niobium oxide ($Nb_2O_3$) (ICP elementary analysis values in a thin film thereof: $[In]/([In]+[Zn])=0.89$, and $[Nb]/([In]+[Zn]+[Nb])=0.0036$) was used. The surface resistance of the thus-yielded color filter for liquid crystal display (the surface resistance of the liquid-crystal-driving transparent electrode) was 19 Ω/□.

In particular, in the above-mentioned expressions, [Nb] represents the number of the niobium atoms in unit mass (this matter is the same in the following description). In other words, the above-mentioned expressions each represent the ratio between the atoms.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-3 was made of amorphous oxide on the basis of the measurement result of X-ray analysis of a transparent electrode formed directly onto a glass substrate under the same conditions as in the present Example 2-3.

EXAMPLE 2-4

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$) and niobium oxide ($Nb_2O_3$) (ICP elementary analysis values in a thin film thereof: $[In]/([In]+[Zn])=0.89$, and $[Nb]/([In]+[Zn]+[Nb])=0.0045$) was used. The surface resistance of the thus-yielded color filter for liquid crystal display (the surface resistance of the liquid-crystal-driving transparent electrode) was 19 Ω/□.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-4 was made of amorphous oxide on the basis of the measurement result of X-ray analysis of a transparent electrode formed directly onto a glass substrate under the same conditions as in the present Example 2-4.

EXAMPLE 2-5

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$) and zirconium oxide ($ZrO_2$) (ICP elementary analysis values in a thin film thereof: $[In]/([In]+[Zn])=0.89$, and $[Zr]/([In]+[Zn]+[Zr])=0.0042$) was used. The surface resistance of the thus-yielded color filter for liquid crystal display (the surface resistance of the liquid-crystal-driving transparent electrode) was 19 Ω/□.

In particular, in the above-mentioned expressions, [Zr] represents the number of the zirconium atoms in unit mass (this matter is the same in the following description). In other words, the above-mentioned expressions each represent the ratio between the atoms.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-5 was made of amorphous oxide on the basis of the measurement result of X-ray analysis of a transparent electrode formed directly onto a glass substrate under the same conditions as in the present Example 2-5.

EXAMPLE 2-6

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$) and zirconium oxide ($ZrO_2$) (ICP elementary analysis values in a thin film thereof: [In]/([In]+[Zn])=0.89, and [Zr]/([In]+[Zn]+[Zr])=0.0064) was used. The surface resistance of the thus-yielded color filter for liquid crystal display (the surface resistance of the liquid-crystal-driving transparent electrode) was 19 $\Omega/\square$.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-6 was made of amorphous oxide on the basis of the measurement result of X-ray analysis of a transparent electrode formed directly onto a glass substrate under the same conditions as in the present Example 2-6.

EXAMPLE 2-7

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), rhenium oxide ($ReO_3$) and tin oxide ($SnO_2$) (ICP elementary analysis values in a thin film thereof: [In]/([In]+[Zn])=0.89, [Re]/([In]+[Zn]+[Re])=0.0004, and [Sn]/([In]+[Zn]+[Re]+[Sn])=0.021) was used. The surface resistance of the thus-yielded color filter for liquid crystal display (the surface resistance of the liquid-crystal-driving transparent electrode) was 17 $\Omega/\square$.

In particular, in the above-mentioned expressions, [Sn] represents the number of the tin atoms in unit mass (this matter is the same in the following description). In other words, the above-mentioned expressions each represent the ratio between the atoms.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-7 was made of amorphous oxide on the basis of the measurement result of X-ray analysis of a transparent electrode formed directly onto a glass substrate under the same conditions as in the present Example 2-7.

EXAMPLE 2-8

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), zirconium oxide ($ZrO_2$) and tin oxide ($SnO_2$) (ICP elementary analysis values in a thin film thereof: [In]/([In]+[Zn])=0.89, [Zr]/([In]+[Zn]+[Zr])=0.0067, and [Sn]/([In]+[Zn]+[Zr]+[Sn])=0.028) was used. The surface resistance of the thus-yielded color filter for liquid crystal display (the surface resistance of the liquid-crystal-driving transparent electrode) was 18 $\Omega/\square$.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-8 was made of amorphous oxide on the basis of the measurement result of X-ray analysis of a transparent electrode formed directly onto a glass substrate under the same conditions as in the present Example 2-8.

EXAMPLE 2-9

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), tungsten oxide ($WO_5$) and tin oxide ($SnO_2$) (ICP elementary analysis values in a thin film thereof: [In]/([In]+[Zn])=0.89, [W]/([In]+[Zn]+[W])=0.0013, and [Sn]/([In]+[Zn]+[W]+[Sn])=0.022) was used. The surface resistance of the thus-yielded color filter for liquid crystal display (the surface resistance of the liquid-crystal-driving transparent electrode) was 17 $\Omega/\square$.

In particular, in the above-mentioned expressions, [W] represents the number of the tungsten atoms in unit mass (this matter is the same in the following description). In other words, the above-mentioned expressions each represent the ratio between the atoms.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the Liquid-crystal-driving transparent electrode produced in the present Example 2-9 was made of amorphous oxide on the basis of the measurement result of X-ray analysis of a transparent electrode formed directly onto a glass substrate under the same conditions as in the present Example 2-9.

EXAMPLE 2-10

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), molybdenum oxide ($MoO_6$) and tin oxide ($SnO_2$) (ICP elementary analysis values in a thin film thereof: [In]/([In]+[Zn])=0.89, [Mo]/([In]+[Zn]+[Mo])=0.0042, and [Sn]/([In]+[Zn]+[Mo]+[Sn])=0.022) was used. The surface resistance of the thus-yielded color filter for liquid crystal display (the surface resistance of the liquid-crystal-driving transparent electrode) was 17 $\Omega/\square$.

In particular, in the above-mentioned expressions, [Mo] represents the number of the molybdenum atoms in unit mass (this matter is the same in the following description). In other words, the above-mentioned expressions each represent the ratio between the atoms.

This color filter for liquid crystal display was not recognized as a deformed color filter, and exhibited a good external appearance. The liquid-crystal-driving transparent electrode in this color filter for liquid crystal display was tested and measured about the same items as in Example 2-1. The results are shown in Table 2-1. It was ascertained that the liquid-crystal-driving transparent electrode produced in the present Example 2-10 was made of amorphous oxide on the basis of the measurement result of X-ray analysis of a transparent electrode formed directly onto a glass substrate under the same conditions as in the present Example 2-10.

COMPARATIVE EXAMPLE 2-1

A color filter for liquid crystal display was produced in the same way as in Example 2-1 except that when its liquid-crystal-driving transparent electrode was formed, an ITO target (containing 5% by weight of $SnO_2$) was used. The surface resistance of the thus-yielded color filter for liquid crystal display (the surface resistance of the liquid-crystal-driving transparent electrode) was 15 Ω/□.

The liquid-crystal-driving transparent electrode in this color filter for liquid crystal display was tested and measured about the same items as in Example 2-1. However, this ITO film was not permitted to be etched with oxalic acid. The results are shown in Table 2-1. According to the measurement result of X-ray analysis of a transparent electrode formed directly onto a glass substrate under the same conditions as in the present Comparative Example 2-1, a peak of indium oxide was recognized. Consequently, it was ascertained that the electrode was crystalline.

COMPARATIVE EXAMPLE 2-2

A color filter for liquid crystal display was produced in the same way as in Example 2-1 except that when its liquid-crystal-driving transparent electrode was formed, a sintered body target made of a hexagonal lamellar compound represented by $In_2O_3(ZnO)_5$ and indium oxide ($In_2O_3$) (ICP elementary analysis values in a thin film thereof: [In] ([In]+[Zn])=0.89) was used. The surface resistance of the thus-yielded color filter for liquid crystal display (the surface resistance of the liquid-crystal-driving transparent electrode) was 30 Ω/□.

The liquid-crystal-driving transparent electrode in this color filter for liquid crystal display was tested and measured about the same items as in Example 2-1. The results are shown in Table 2-1. According to the measurement result of X-ray analysis of a transparent electrode formed directly onto a glass substrate under the same conditions as in the present Comparative Example 2-2, no peak of indium oxide was recognized. Consequently, the electrode was amorphous.

COMPARATIVE EXAMPLE 2-3

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), and rhenium oxide ($ReO_3$) (ICP elementary analysis values in a thin film thereof: [In]/([In]+[Zn])=0.89, and [Re]/([In]+[Zn]+[Re])=0.015) was used. The surface resistance of the thus-yielded color filter for liquid crystal display (the surface resistance of the liquid-crystal-driving transparent electrode) was 22 Ω/□.

The liquid-crystal-driving transparent electrode in this color filter for liquid crystal display was tested and measured about the same items as in Example 2-1. The results are shown in Table 2-1. According to the measurement result of X-ray analysis of a transparent electrode formed directly onto a glass substrate under the same conditions as in the present Comparative Example 2-3, no peak of indium oxide was recognized. Consequently, the electrode was amorphous.

COMPARATIVE EXAMPLE 2-4

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), and niobium oxide ($Nb_2O_5$) (ICP elementary analysis values in a thin film thereof: [In]/([In]+[Zn])=0.89, and [Nb]/([In]+[Zn]+[Nb])=0.025) was used. The surface resistance of the thus-yielded color filter for liquid crystal display (the surface resistance of the liquid-crystal-driving transparent electrode) was 22 Ω/□.

The liquid-crystal-driving transparent electrode in this color filter for liquid crystal display was tested and measured about the same items as in Example 2-1. The results are shown in Table 2-1. According to the measurement result of X-ray analysis of a transparent electrode formed directly onto a glass substrate under the same conditions as in the present Comparative Example 2-4, no peak of indium oxide was recognized. Consequently, the electrode was amorphous.

COMPARATIVE EXAMPLE 2-5

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), and tin oxide ($SnO_2$) (ICP elementary analysis values in a thin film thereof: [In]/([In]+[Zn])=0.89, and [Sn]/([In]+[Zn]+[Sn])=0.05) was used. The surface resistance of the thus-yielded color filter for liquid crystal display (the surface resistance of the liquid-crystal-driving transparent electrode) was 28 Ω/□.

The liquid-crystal-driving transparent electrode in this color filter for liquid crystal display was tested and measured about the same items as in Example 2-1. The results are shown in Table 2-1. According to the measurement result of X-ray analysis of a transparent electrode formed directly onto a glass substrate under the same conditions as in the present Comparative Example 2-5, no peak of indium oxide was recognized. Consequently, the electrode was amorphous.

COMPARATIVE EXAMPLE 2-6

A color filter for liquid crystal display was produced in the same way as in Example 2-1 except that when its liquid-crystal-driving transparent electrode was formed, a sintered body target consisting essentially of a hexagonal lamellar compound represented by $In_2O_3(ZnO)_5$, indium oxide ($In_2O_3$), rhenium oxide ($ReO_3$) and tin oxide ($SnO_2$) (ICP elementary analysis values in a thin film thereof: [In]/([In]+[Zn])=0.89, [Re]/([In]+[Zn]+[Re])=0.001, and [Sn]/([In]+[Zn]+[Re]+[Sn])=0.05) was used. The surface resistance of the thus-yielded color filter for liquid crystal display (the surface resistance of the liquid-crystal-driving transparent electrode) was 27 Ω/□.

The liquid-crystal-driving transparent electrode in this color filter for liquid crystal display was tested and measured about the same items as in Example 2-1. The results are shown in Table 2-1. According to the measurement result of X-ray analysis of a transparent electrode formed directly onto a glass substrate under the same conditions as in the present Comparative Example 2-6, no peak of indium oxide was recognized. Consequently, the electrode was amorphous.

each of the liquid-crystal-driving transparent electrodes formed in Examples 2-1 to 2-10. In the liquid-crystal-driving

TABLE 2-1

Table 2-1

| No. | Thin film composition | | | | Surface resistance |
|---|---|---|---|---|---|
| | In/(In + Zn) | M | M/(In + Zn + M) | Sn/(In + Zn + M + Sn) | $\Omega/\square$ |
| Example 2-1 | 0.89 | Re | 0.0005 | — | 18 |
| Example 2-2 | 0.83 | Re | 0.0035 | — | 19 |
| Example 2-3 | 0.89 | Nb | 0.0035 | — | 19 |
| Example 2-4 | 0.89 | Nb | 0.0045 | — | 19 |
| Example 2-5 | 0.89 | Zr | 0.0042 | — | 19 |
| Example 2-6 | 0.89 | Zr | 0.0064 | — | 19 |
| Example 2-7 | 0.89 | Re | 0.0004 | 0.021 | 17 |
| Example 2-8 | 0.89 | Zr | 0.0067 | 0.028 | 18 |
| Example 2-9 | 0.89 | W | 0.0013 | 0.022 | 17 |
| Example 2-10 | 0.89 | Mo | 0.0042 | 0.022 | 17 |
| Comparative Example 2-1 | | | ITO(SnO$_2$: 5 wt %) | | 15 |
| Comparative Example 2-2 | 0.89 | — | — | — | 30 |
| Comparative Example 2-3 | 0.89 | Re | 0.015 | — | 22 |
| Comparative Example 2-4 | 0.89 | Nb | 0.025 | — | 22 |
| Comparative Example 2-5 | 0.89 | — | — | 0.05 | 28 |
| Comparative Example 2-6 | 0.89 | Re | 0.001 | 0.05 | 27 |

| No. | Tape peeling test | Moisture and heat resistance test | Heat resistance test | Residues after the etching |
|---|---|---|---|---|
| Example 2-1 | 100/100 | ○ | ○ | Not observed |
| Example 2-2 | 100/100 | ○ | ○ | Not observed |
| Example 2-3 | 100/100 | ○ | ○ | Not observed |
| Example 2-4 | 100/100 | ○ | ○ | Not observed |
| Example 2-5 | 100/100 | ○ | ○ | Not observed |
| Example 2-6 | 100/100 | ○ | ○ | Not observed |
| Example 2-7 | 100/100 | ○ | ○ | Not observed |
| Example 2-8 | 100/100 | ○ | ○ | Not observed |
| Example 2-9 | 100/100 | ○ | ○ | Not observed |
| Example 2-10 | 100/100 | ○ | ○ | Not observed |
| Comparative Example 2-1 | 85/100 | X | X | Unable to be etched |
| Comparative Example 2-2 | 100/100 | ○ | ○ | Not observed |
| Comparative Example 2-3 | 100/100 | ○ | ○ | Not observed |
| Comparative Example 2-4 | 100/100 | ○ | ○ | Not observed |
| Comparative Example 2-5 | 100/100 | ○ | ○ | Observed |
| Comparative Example 2-6 | 100/100 | ○ | ○ | Observed |

○: The generation of cracks, creases or peeling was not recognized.
X: The generation of cracks, creases or peeling was recognized.

As is evident from Table 2-1, in each of the color filters for liquid crystal display obtained in Examples 2-1 to 2-10, its surface resistance value was made into a low value of 20 $\Omega/\square$ or less and further in the production process thereof no cracks, creases or peeling was generated in its liquid-crystal-driving transparent electrode. It can also be said from the results of the tape peeling test that the adhesiveness of the liquid-crystal-driving transparent electrode was high. Furthermore, each of the liquid-crystal-driving transparent electrodes had excellent water resistance and heat resistance. This matter demonstrated that even after the production of the color filter, its liquid-crystal-driving transparent electrode was not easily cracked or peeled with the passage of time.

On the other hand, in the color filter for liquid crystal display obtained in Comparative Example 2-1, etching with oxalic acid was not permitted in the production process thereof. In its liquid-crystal-driving transparent electrode, cracks, creases or peeling was generated. It would be said from the result of the tape peeling test that the adhesiveness of the liquid-crystal-driving transparent electrode was low. It is clear from the tables that the water resistance and the heat resistance of the liquid-crystal-driving transparent electrode formed in Comparative Example 2-1 were lower than those of transparent electrodes described in Comparative Examples 2-2 to 2-6, cracks, creases or peeling was not generated but the surface resistance thereof was 20 $\Omega/\square$ or more. Thus, when the liquid crystal is driven, troubles may be caused.

The invention claimed is:

1. An amorphous transparent electroconductive film, comprising at least indium oxide and zinc oxide, and further comprising one or more third metals selected from Re, W, and Mo, wherein the following expressions (1) and (2) are satisfied:

$$0.75 \leq [\text{In}]/([\text{In}]+[\text{Zn}]) \leq 0.95 \tag{1}$$

$$1.0 \times 10^{-4} \leq [\text{Re}]/([\text{In}]+[\text{Zn}]+[\text{Re}]) \leq 1.0 \times 10^{-3} \tag{2-1}$$

$$1.0 \times 10^{-4} \leq [\text{W}]/([\text{In}]+[\text{Zn}]+[\text{W}]) \leq 1.0 \times 10^{-2} \tag{2-2}$$

$$1.0 \times 10^{-3} \leq [\text{Mo}]/([\text{In}]+[\text{Mo}]) \leq 4.2 \times 10^{-3} \tag{2-3}$$

where [In], [Zn] [Re], [W], or [Mo] represents the atomic number of In, that of Zn, that of that of Re, that of W, or that of Mo, respectively.

2. The amorphous transparent electroconductive film according to claim 1, further comprising tin.

3. The amorphous transparent electroconductive film according to claim 2, wherein the value of said $[Sn]/([In]+[Zn]+[Sn])$ is from $1.0\times10^{-2}$ to $9.0\times10^{-2}$ where $[Sn]$ represents the atomic number of Sn.

4. An amorphous transparent electrode substrate, wherein one or more of said amorphous transparent electroconductive films as claimed in claim 1 are formed on a substrate.

5. A process for producing the amorphous transparent electrode substrate according to claim 4, comprising utilizing a sputtering target for an amorphous transparent electroconductive film wherein the sputtering target comprises indium oxide, zinc oxide, and one or more third metals selected from Re, W, and Mo to form said amorphous transparent electroconductive film on a substrate, and the step of heating said amorphous transparent electroconductive film on said substrate up to 200° C. or higher.

6. The process for producing the amorphous transparent electrode substrate according to claim 5, wherein said heating step is performed in a state in which concentration of oxygen is 0.1% or less by volume.

7. The process for producing the amorphous transparent electrode substrate according to claim 5, wherein said heating step is performed in a state in which hydrogen is also present.

8. The process for producing the amorphous transparent electrode substrate according to claim 7, wherein concentration of said hydrogen is from 1 to 10% by volume.

9. A sputtering target for amorphous transparent electroconductive film, comprising indium oxide,
zinc oxide, and
one or more third metals selected from Re, W, and Mo
wherein the following expressions are satisfied:

$$0.75 \leq [In]/([In]+[Zn]) \leq 0.95 \qquad (3)$$

$$1.0\times10^{-4} \leq [Re]/([In]+[Zn]+[Re]) \leq 3.7\times10^{-3} \qquad (4\text{-}1)$$

$$1.0\times10^{-4} \leq [W]/([In]+[Zn]+[W]) \leq 1.0\times10^{-2} \qquad (4\text{-}2)$$

$$1.0\times10^{-3} \leq [Mo]/([In]+[Zn]+[Mo]) \leq 4.2\times10^{-3} \qquad (4\text{-}3)$$

where $[In], [Zn]$ $[Re], [W]$, or $[Mo]$ represents the atomic number of In, that of Zn, that of that of Re, that of W, or that of Mo, respectively.

10. The sputtering target according to claim 9, further comprising tin.

11. The sputtering target according to claim 10, wherein the value of said $[Sn]/([In]+[Zn]+[Sn])$ is from $1.0\times10^{-2}$ to $9.0\times10^{-2}$ where $[Sn]$ represents the atomic number of Sn.

12. The sputtering target according to claim 9, wherein the maximum crystal grain diameter of said zinc oxide in said sputtering target is 5 μm or less.

13. The sputtering target according to claim 9, wherein said third metals(s) is/are dispersed in a phase of said indium oxide.

* * * * *